(12) United States Patent
Kikuchi

(10) Patent No.: US 8,350,335 B2
(45) Date of Patent: Jan. 8, 2013

(54) SEMICONDUCTOR DEVICE INCLUDING OFF-SET SPACERS FORMED AS A PORTION OF THE SIDEWALL

(75) Inventor: Yoshiaki Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/101,568

(22) Filed: Apr. 11, 2008

(65) Prior Publication Data

US 2008/0258216 A1   Oct. 23, 2008

(30) Foreign Application Priority Data

Apr. 18, 2007  (JP) ................................ 2007-108953
Mar. 10, 2008  (JP) ................................ 2008-060164

(51) Int. Cl.
*H01L 21/70* (2006.01)

(52) U.S. Cl. .......................... 257/374; 257/394; 257/410

(58) Field of Classification Search .................. 257/374, 257/392, 406, 410, E21.625
See application file for complete search history.

(56) References Cited

U.S. PATENT DOCUMENTS

| 6,784,038 | B2* | 8/2004 | Tanabe et al. | 438/199 |
| 7,569,888 | B2* | 8/2009 | Sudo | 257/369 |
| 2005/0205940 | A1* | 9/2005 | Ootsuka | 257/374 |
| 2006/0160356 | A1* | 7/2006 | Hwang | 438/637 |

FOREIGN PATENT DOCUMENTS

| JP | 11-074508 | 3/1999 |
| JP | 2004-014875 | 1/2004 |
| JP | 2005-303256 | 10/2005 |
| JP | 2006-523379 | 10/2012 |

OTHER PUBLICATIONS

Japanese Office Action dated Jul. 3, 2012 for counter-part Japanese Application No. 2008-060164.

* cited by examiner

*Primary Examiner* — Howard Weiss
*Assistant Examiner* — Steven Rao
(74) *Attorney, Agent, or Firm* — SNR Denton US LLP

(57) ABSTRACT

A method of manufacturing a semiconductor device that includes forming a dummy gate insulating film and a dummy gate electrode on a semiconductor substrate having a channel-forming region. An etching treatment including a first treatment of treating the surface of the exposed surface of the insulating layer with an etching gas containing ammonia and hydrogen fluoride and a second treatment of decomposing and evaporating the product formed in the first treatment are included in removal step of the dummy gate insulating film.

7 Claims, 18 Drawing Sheets

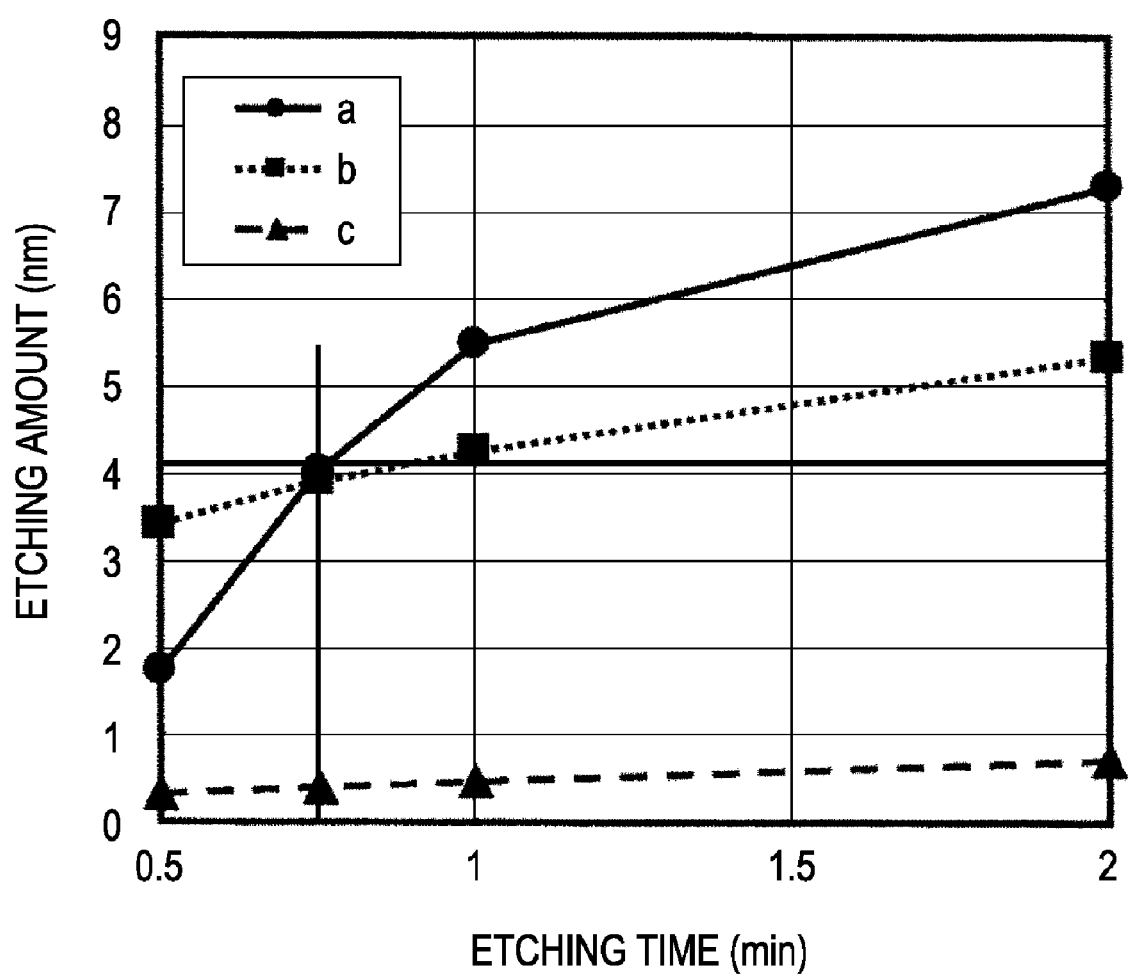

SEMICONDUCTOR DEVICE INCLUDING OFF-SET SPACERS FORMED AS A PORTION OF THE SIDEWALL

CROSS-REFERENCE TO RELATED APPLICATIONS

The present invention contains subject matter related to Japanese Patent Application JP 2007-108953 filed in the Japanese Patent Office on Apr. 18, 2007, and Japanese Patent Application JP 2008-060164 filed in the Japanese Patent Office on Mar. 10, 2008, the entireties of which are also incorporated herein by reference to the extent permitted by law.

BACKGROUND OF THE INVENTION

1. Field of the Invention

The present invention relates to a semiconductor device and a method for manufacturing the same, and particularly to a semiconductor device including a field effect transistor and a method for manufacturing the same.

2. Description of the Related Art

In a method for manufacturing a semiconductor device, a damascene process is generally used as a method of forming wiring.

In the damascene process, for example, a trench for a gate electrode is formed in an insulating film on a substrate, and a conductive material is deposited to fill the trench for a gate electrode and then removed from the outside the trench by CMP (Chemical Mechanical Polishing), leaving the conductive material in the trench for a gate electrode to form wiring.

MOSFET (metal-oxide-semiconductor field effect transistor; referred to as a "MOS transistor" hereinafter) which is a basic element of a semiconductor device is increasingly miniaturized with advances in miniaturization and increase in integration of semiconductor devices. Therefore, the gate length and the thickness of a gate insulating film are decreased in association with scaling.

A SiON insulating film used as a gate insulating film causes large leakage after the 32-nm generation, and thus it is difficult to use the SiON insulating film as a gate insulating film.

Therefore, there is studied a method using a high-dielectric-constant film (so-called High-k film) capable of being increased in physical film thickness as a gate insulating film material.

Since the High-k film generally has low heat resistance, a gate insulating film is desirably formed after diffusion heat treatment of a source-drain region in which high-temperature treatment is performed.

As a method for permitting this procedures, a damascene gate process of forming a gate electrode of a MOS transistor using the Damascene process is generally used.

Japanese Unexamined Patent Application Publication No. 2005-303256 discloses a method for forming a MOS transistor having a source-drain region provided with an extension region using the damascene gate process.

In this method, for example, a dummy gate insulating film and a dummy gate electrode are formed on an active region of a semiconductor substrate, offset spacers composed of silicon nitride are formed on both sides of the dummy insulating film on the substrate, and the semiconductor substrate is implanted with ions using the dummy gate electrode and the offset spacers as a mask to form extension regions.

Next, sidewall spacers are formed on both sides of the offset spacers on the substrate, and the semiconductor substrate is implanted with ions using the dummy gate electrode, the offset spacers, and the sidewall spacers as a mask to form source-drain regions.

As described above, the source-drain regions each provided with the extension region are formed.

Next, an interlayer insulating film is formed over the entire surface to cover the dummy gate electrode, the top surface is polished until the surface of the dummy gate electrode is exposed, and then the dummy gate electrode and the dummy gate insulating film are removed by etching to form a trench for a gate electrode.

Next, a gate insulating film is formed at the bottom of the trench for a gate electrode, and then a gate electrode is formed on the gate insulating film to fill the trench for a gate electrode.

As described above, a MOS transistor is formed using the damascene process.

When the trench for a gate electrode is formed, the dummy gate insulating film is preferably removed by wet etching in order to prevent damage to the substrate. Therefore, in Japanese Unexamined Patent Application Publication No. 2005-303256, the offset spacers are composed of silicon nitride in order to prevent the offset spacers from being removed by wet etching.

Although the offset spacers can be prevented from being removed by the wet etching, a parasitic capacity between the gate electrode and the source-drain regions is increased because the dielectric constant of silicon nitride is higher than that of silicon oxide. This causes deterioration in MOS transistor characteristics.

SUMMARY OF THE INVENTION

A problem to be solved is that it is difficult to form a transistor having high characteristics when a MOS transistor is formed using a damascene process.

A semiconductor device according to an embodiment of the present invention includes a field effect transistor including a semiconductor substrate having a channel-forming region, an insulating film formed on the semiconductor substrate, a gate electrode trench formed in the insulating film, a gate insulating film formed at the bottom of the gate electrode trench, a gate electrode formed on the gate insulating film to fill the gate electrode trench, offset spacers composed of silicon oxide or boron-containing silicon nitride and formed as a portion of the insulating film to constitute the sidewall of the gate electrode trench, sidewall spacers formed as a portion of the insulating film on both sides of the offset spacers on the side away from the gate electrode, and source-drain regions each having an extension region and formed in the semiconductor substrate and below at least the offset spacers and the sidewall spacers.

The semiconductor device includes the insulating film formed on the semiconductor substrate having the channel-forming region, the gate electrode trench formed in the insulating film, the gate insulating film formed at the bottom of the gate electrode trench, and the gate electrode formed on the gate insulating film to fill the gate electrode trench.

Also, the offset spacers composed of silicon oxide or boron-containing silicon nitride are formed as a portion of the insulating film to constitute the sidewall of the gate electrode trench, and the sidewall spacers are formed as a portion of the insulating film on both sides of the offset spacers on the side away from the gate electrode.

Further, the source-drain regions each having an extension region are formed in the semiconductor substrate and below at least the offset spacers and the sidewall spacers.

The field effect transistor is configured as described above.

A semiconductor device according to another embodiment of the present invention includes a field effect transistor including a semiconductor substrate having a channel-forming region, an insulating film formed on the semiconductor substrate, a gate electrode trench formed in the insulating film, a gate insulating film formed at the bottom of the gate electrode trench, a gate electrode formed on the gate insulating film to fill the gate electrode trench, offset spacers each including a silicon nitride film or a boron-containing silicon nitride film and a silicon oxide film, which are laminated from the gate electrode side, and formed as a portion of the insulating film to constitute the sidewall of the gate electrode trench, sidewall spacers formed as a portion of the insulating film on both sides of the offset spacers on the side away from the gate electrode, and source-drain regions each having an extension region and formed in the semiconductor substrate and below at least the offset spacers and the sidewall spacers.

The semiconductor device includes the insulating film formed on the semiconductor substrate having the channel-forming region, the gate electrode trench formed in the insulating film, the gate insulating film formed at the bottom of the gate electrode trench, and the gate electrode formed on the gate insulating film to fill the gate electrode trench.

Also, the offset spacers each including a silicon nitride film or a boron-containing silicon nitride film and a silicon oxide film which are laminated from the gate electrode side are formed as a portion of the insulating film to constitute the sidewall of the gate electrode trench, and the sidewall spacers are formed as a portion of the insulating film on both sides of the offset spacers on the side away from the gate electrode.

Further, the source-drain regions each having an extension region are formed in the semiconductor substrate and below at least the offset spacers and the sidewall spacers.

The field effect transistor is configured as described above.

A method of manufacturing a semiconductor device according to a further embodiment of the present invention includes the steps of forming a dummy gate insulating film and a dummy gate electrode on a semiconductor substrate having a channel-forming region, forming offset spacers composed of silicon oxide or boron-containing silicon nitride on both sides of the dummy gate electrode, forming extension regions in the semiconductor substrate using the offset spacers and the gate electrode as a mask, forming sidewall spacers on both sides of the offset spacers, forming source-drain regions in the semiconductor substrate using the sidewall spacers, the offset spacers, and the gate electrode as a mask, forming an insulating film to cover the dummy gate electrode, removing the insulating film until the dummy gate electrode is exposed from the top of the insulating film, removing the dummy gate electrode and the dummy gate insulating film to form a gate electrode trench, forming a gate insulating film at the bottom of the gate electrode trench, forming a conductive layer on the gate insulating film to fill the gate electrode trench, and removing the conductive layer from the outside of the gate electrode trench to form a field effect transistor. At least the step of removing the dummy gate insulating film includes an etching treatment including a first treatment of treating the surface of the exposed surface of the insulating layer with an etching gas containing ammonia and hydrogen fluoride and a second treatment of decomposing and evaporating the product formed in the first treatment.

In the method of manufacturing a semiconductor device, a dummy gate insulating film and a dummy gate electrode are formed on a semiconductor substrate having a channel-forming region, offset spacers composed of silicon oxide or boron-containing silicon nitride are formed on both sides of the dummy gate electrode, and extension regions are formed in the semiconductor substrate using the offset spacers and the gate electrode as a mask.

Next, sidewall spacers are on both sides of the offset spacers, and source-drain regions are formed in the semiconductor substrate using the sidewall spacers, the offset spacers, and the gate electrode as a mask.

Next, an insulating film is formed to cover the dummy gate electrode, the insulating film is removed until the dummy gate electrode is exposed from the top of the insulating film, and the dummy gate electrode and the dummy gate insulating film are removed to form a gate electrode trench.

Next, a gate insulating film is formed at the bottom of the gate electrode trench, a conductive layer is formed on the gate insulating film to fill the gate electrode trench, and the conductive layer is removed from the outside of the gate electrode trench.

In this way, a field effect transistor is formed.

At least the step of removing the dummy gate insulating film includes an etching treatment including a first treatment of treating the exposed surface of the insulating layer with an etching gas containing ammonia and hydrogen fluoride and a second treatment of decomposing and evaporating the product formed in the first treatment.

A method of manufacturing a semiconductor device according to a still further embodiment of the present invention includes the steps of forming a dummy gate insulating film and a dummy gate electrode on a semiconductor substrate having a channel-forming region, laminating in order a silicon nitride film and a silicon oxide film or a boron-containing silicon nitride film to form offset spacers on both sides of the dummy gate electrode, forming extension regions in the semiconductor substrate using the offset spacers and the gate electrode as a mask, forming sidewall spacers on both sides of the offset spacers, forming source-drain regions in the semiconductor substrate using the sidewall spacers, the offset spacers, and the gate electrode as a mask, forming an insulating film to cover the dummy gate electrode, removing the insulating film until the dummy gate electrode is exposed from the top of the insulating film, removing the dummy gate electrode and the dummy gate insulating film to form a gate electrode trench and removing the silicon nitride film constituting the offset spacers, forming a gate insulating film at the bottom of the gate electrode trench, forming a conductive layer on the gate insulating film to fill the gate electrode trench, and removing the conductive layer from the outside of the gate electrode trench to form a field effect transistor.

In the method of manufacturing a semiconductor device, a dummy gate insulating film and a dummy gate electrode are formed on a semiconductor substrate having a channel-forming region, a silicon nitride film and a silicon oxide film or a boron-containing silicon nitride film are laminated in order to form offset spacers on both sides of the dummy gate electrode, and extension regions are formed in the semiconductor substrate using the offset spacers and the gate electrode as a mask.

Next, sidewall spacers are formed on both sides of the offset spacers, and source-drain regions are formed in the semiconductor substrate using the sidewall spacers, the offset spacers, and the gate electrode as a mask.

Next, an insulating film is formed to cover the dummy gate electrode, the insulating film is removed until the dummy gate electrode is exposed from the top of the insulating film, the dummy gate electrode and the dummy, gate insulating film are removed to form a gate electrode trench, and the silicon nitride film constituting the offset spacers is removed.

Next, a gate insulating film is formed at the bottom of the gate electrode trench, a conductive layer is formed on the gate insulating film to fill the gate electrode trench, and the conductive layer is removed from the outside of the gate electrode trench.

In this way, a field effect transistor is formed.

A method of manufacturing a semiconductor device according to a still further embodiment of the present invention includes the steps of forming a dummy gate insulating film and a dummy gate electrode on a semiconductor substrate having a channel-forming region, laminating in order a silicon nitride film or a boron-containing silicon nitride film and a silicon oxide film to form offset spacers on both sides of the dummy gate electrode, forming extension regions in the semiconductor substrate using the offset spacers and the gate electrode as a mask, forming sidewall spacers on both sides of the offset spacers, forming source-drain regions in the semiconductor substrate using the sidewall spacers, the offset spacers, and the gate electrode as a mask, forming an insulating film to cover the dummy gate electrode, removing the insulating film until the dummy gate electrode is exposed from the top of the insulating film, removing the dummy gate electrode and the dummy gate insulating film to form a gate electrode trench while leaving at least a portion of the silicon nitride film or the boron-containing silicon nitride film constituting the offset spacers, forming a gate insulating film at the bottom of the gate electrode trench, forming a conductive layer on the gate insulating film to fill the gate electrode trench, and removing the conductive layer from the outside of the gate electrode trench to form a field effect transistor.

In the method of manufacturing a semiconductor device, a dummy gate insulating film and a dummy gate electrode are formed on a semiconductor substrate having a channel-forming region, a silicon nitride film or a boron-containing silicon nitride film and a silicon oxide film are laminated in order to form offset spacers on both sides of the dummy gate electrode, and extension regions are formed in the semiconductor substrate using the offset spacers and the gate electrode as a mask.

Next, sidewall spacers are formed on both sides of the offset spacers, and source-drain regions are formed in the semiconductor substrate using the sidewall spacers, the offset spacers, and the gate electrode as a mask.

Next, an insulating film is formed to cover the dummy gate electrode, the insulating film is removed until the dummy gate electrode is exposed from the top of the insulating film, and the dummy gate electrode and the dummy gate insulating film are removed to form a gate electrode trench while leaving at least a portion of the silicon nitride film or the boron-containing silicon nitride film constituting the offset spacers.

Next, a gate insulating film is formed at the bottom of the gate electrode trench, a conductive layer is formed on the gate insulating film to fill the gate electrode trench, and the conductive layer is removed from the outside of the gate electrode trench.

In this way, a field effect transistor is formed.

A semiconductor device according to an embodiment of the present invention has a structure in which a silicon oxide film having a lower dielectric constant than that of offset spacers composed of silicon nitride is used and remains after the manufacturing process. Therefore, it may be possible to secure high characteristics as a MOS transistor formed by the damascene gate process.

A method for manufacturing a semiconductor device according to an embodiment of the present invention includes forming offset spacers each including a silicon oxide film having a lower dielectric constant than that of offset spacers composed of silicon nitride when a MOS transistor is formed using the damascene gate process. Since the silicon oxide film is not removed in the manufacturing process, it may be possible to enhance the characteristics of a MOS transistor.

BRIEF DESCRIPTION OF THE DRAWINGS

FIG. 18 is a graph showing etching rates measured in an example of the present invention.

DESCRIPTION OF THE PREFERRED EMBODIMENTS

A semiconductor device and a method for manufacturing the same according to embodiments of the present invention will be described below with reference to the drawings.

First Embodiment

Figure 1:
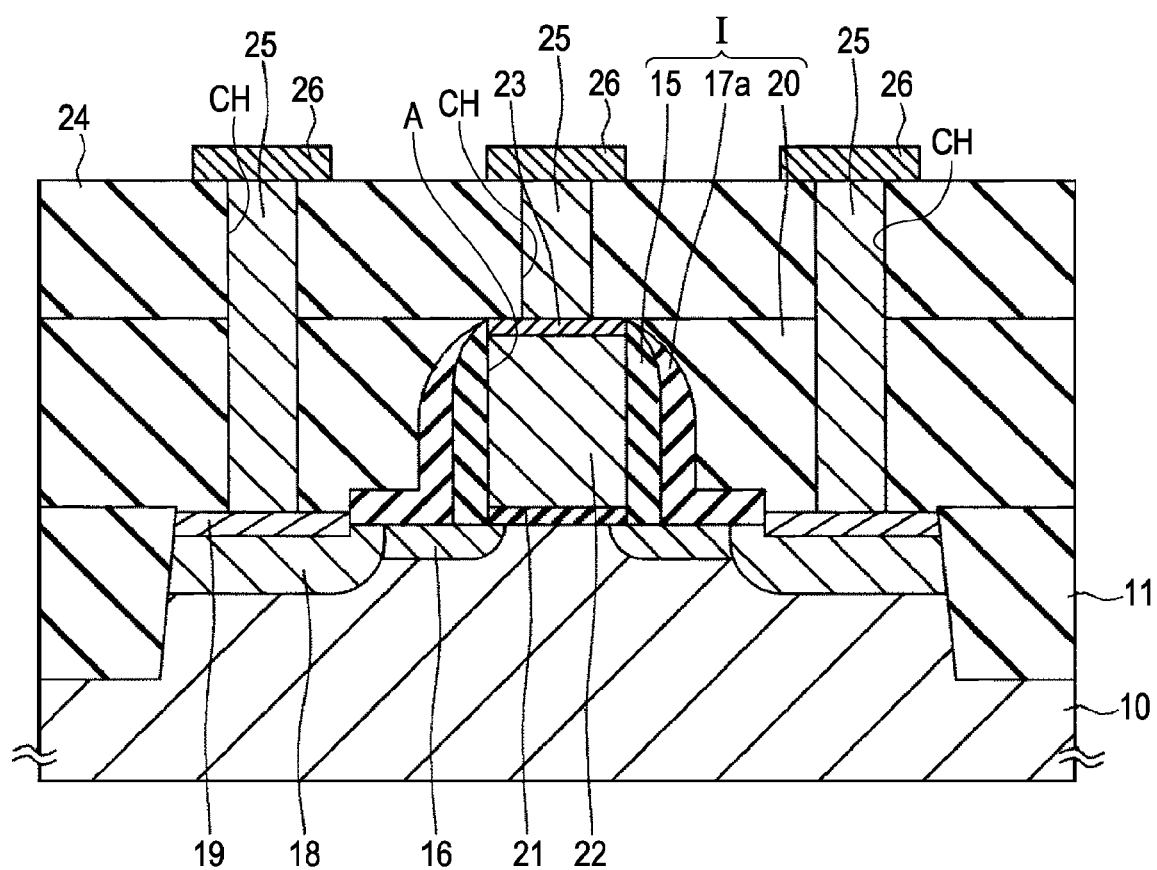
FIG. 1 is a schematic sectional view of a semiconductor device according to a first embodiment of the present invention.

FIG. 1 is a schematic sectional view showing a semiconductor device according to a first embodiment.

For example, element isolation insulating films 11 are formed for an isolating active region on a silicon semiconductor substrate 10, which has a channel-forming region, by a STI (shallow trench isolation) method. Further, an insulating film I including offset spacers 15, silicon nitride films (sidewall spacers) 17a, and an interlayer insulating film 20 is formed on the semiconductor substrate 10.

For example, a gate electrode trench A is formed in the insulating film I, and a gate insulating film 21 including a hafnium oxide film or aluminum oxide film having a higher dielectric constant than that of silicon oxide, i.e., a High-k film, or a silicon oxide film is formed at the bottom of the gate electrode trench A. Further, a gate electrode 22 is formed on the gate insulating film 21 by filling the gate electrode trench A with polysilicon or a metal material. Further, when the gate electrode 22 is composed of polysilicon, as shown in FIG. 1, a refractory metal silicide layer 23 composed of NiSi is formed on the top surface of the gate electrode 22. When the gate electrode 22 is composed of a metal material, for example, a metal selected from the group consisting of tungsten, hafnium, tantalum, titanium, molybdenum, ruthenium, nickel, and platinum, an alloy containing the metal, or a compound of the metal is used.

For example, the offset spacers 15 are formed as a portion of the insulating film I so as to be in contact with the semiconductor substrate 10 and to constitute the sidewall of the gate electrode trench A. The offset spacers 15 are composed of silicon oxide.

The silicon nitride films (sidewall spacers) 17a are formed as a portion of the insulating film I so as to be in contact with the semiconductor substrate 10. The silicon nitride films 17a are formed on both sides of the offset spacers 15 away from the gate electrode 22.

The interlayer insulating film 20 is composed of, for example, silicon oxide.

Further, source-drain regions 18 each having an extension region 16 are formed below at least the offset spacers 15 and the silicon nitride films (sidewall spacers) 17a and on the semiconductor substrate 10. A refractory metal silicide layer 19 composed of NiSi is also formed on the surface layer of each of the source-drain regions 18.

A field effect transistor is configured as described above.

Further, an upper insulating film 24 composed of silicon oxide is formed to cover the insulating film I and the gate electrode 22 (or the refractory metal silicide layer 23). Further, openings CH are provided to pass through the upper insulating film 24 and the interlayer insulating film 20 and reach the refractory metal silicide layer 19 of each of the source-drain regions 18 and the refractory metal silicide layer 23 of the gate electrode 22. Each of the openings CH is filled with a plug 25 composed of a conductive material. Further, an upper wiring 26 composed of a conductive material is formed on the upper insulating film 24 so as to be connected to each of the plugs 25.

The offset spacers 15 are used as a mask layer for forming the extension regions. Therefore, the end positions of the offset spacers 15 away from the gate electrode 22 are used for positioning substantially the channel-side ends of the extension regions 16, depending on the conditions of activation heat treatment. Therefore, the width of each of the offset spacers 15 is related to the profile of the extension regions, and it may be possible to determine from the profile that the silicon oxide film is used for the offset spacers 15.

Also, the silicon nitride films (sidewall spacers) 17a are used as a mask layer for forming the source-drain regions. Therefore, the end positions of the silicon nitride films (sidewall spacers) 17a away from the gate electrode 22 are used for positioning substantially the channel-side ends of the source-drain regions 18, depending on the conditions of activation heat treatment.

The semiconductor device according to this embodiment has a structure in which a silicon oxide film having a lower dielectric constant than that of offset spacers composed of silicon nitride is used and remains after the manufacturing process. Therefore, it may be possible to secure high characteristics as a MOS transistor formed by the damascene gate process.

The material of the offset spacers 15 is not limited to silicon oxide, and boron-containing silicon nitride (SiBN) film may be used. The SiBN film has a lower dielectric constant than that of a silicon nitride film, and the dielectric constant is about 5 at a B/N ratio of 2. Also, the SiBN film has higher acid resistance than that of a silicon oxide film, and thus an etching amount is relatively small. Therefore, even when the SiBN film is used, like in the above-described embodiment, it may be possible to secure high transistor characteristics.

Next, a method for manufacturing the semiconductor device according to this embodiment will be described with reference to the drawings.

Figure 2A:
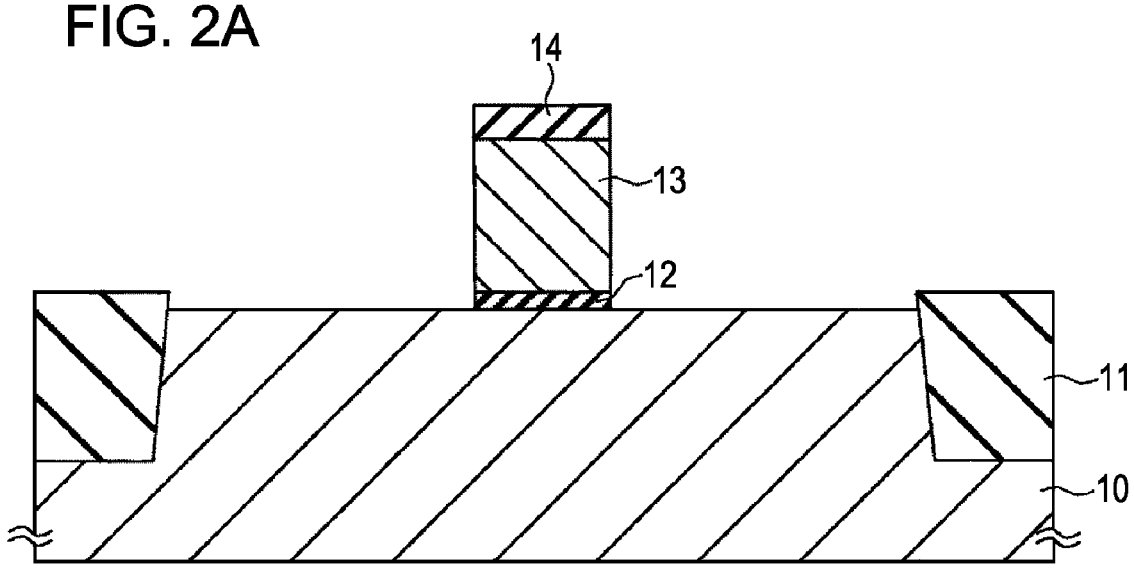
FIGS. 2A and 2B are sectional views each showing a step of a method for manufacturing the semiconductor device according to the first embodiment of the present invention.

First, as shown in FIG. 2A, the element isolation insulating films 11 are formed by a STI (shallow trench isolation) method, for isolating an active region in the silicon semiconductor substrate 10 having a channel-forming region.

Next, silicon oxide is deposited to a thickness of about 4 nm over the entire surface by, for example, a thermal oxidation method, polysilicon is deposited to a thickness of 150 to 200 nm by a CVD (chemical vapor deposition) method, and further silicon nitride is deposited to a thickness of 50 to 100 nm. Then, photolithographic etching is performed except in the gate-forming region to form the dummy insulating film 12 of silicon oxide, the dummy gate electrode 13 of polysilicon, and the hard mask layer 14 of silicon nitride on the gate electrode-forming region in the active region of the semiconductor substrate 10.

Figure 2B:
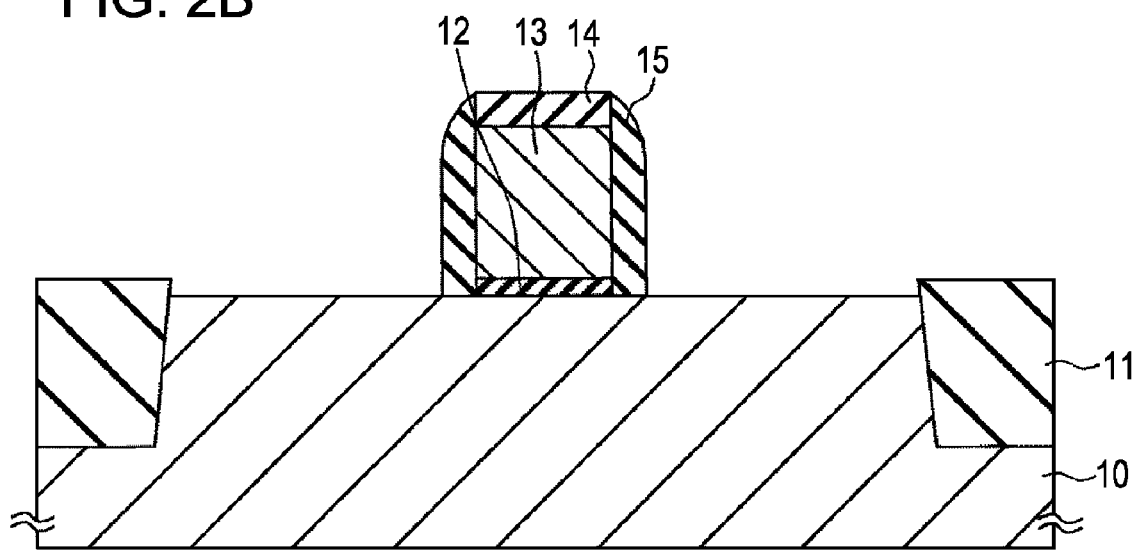

Next, as shown in FIG. 2B, silicon oxide is deposited to a thickness of 8 to 14 nm over the entire surface by the CVD method using, for example, TEOS (tetraethylorthosilicate) as a raw material gas, and then etched back to form the offset spacers 15 on both sides of the dummy gate electrode 13 and in contact with the semiconductor substrate 10.

Figure 3A:
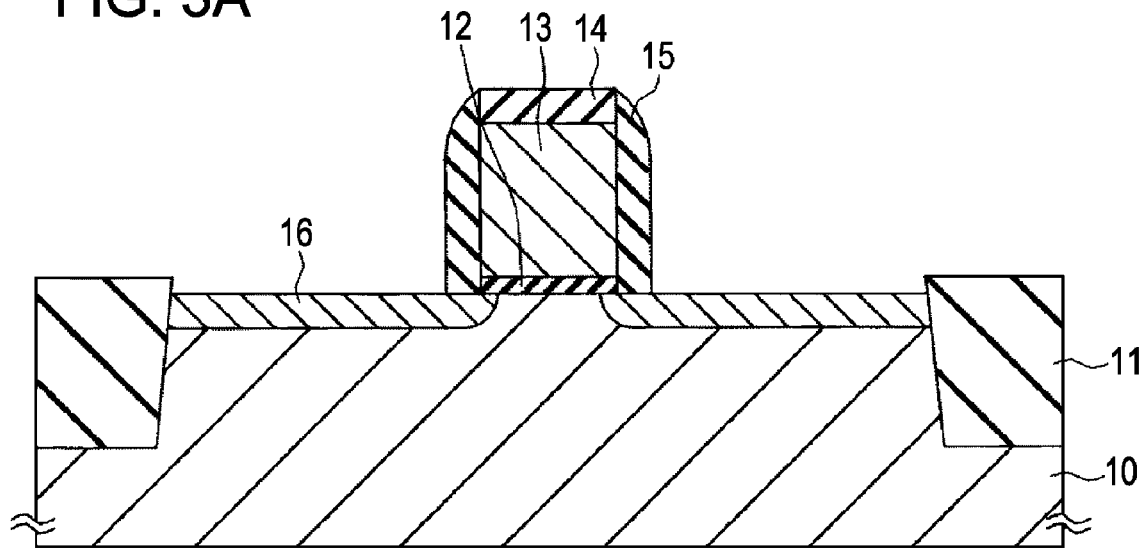
FIGS. 3A and 3B are sectional views each showing a step of the method for manufacturing the semiconductor device according to the first embodiment of the present invention.

Next, as shown in FIG. 3A, the active region is implanted with impurity ions using the offset spacers 15 and the hard mask layer 14 (or the dummy gate electrode 13) as a mask to form a pocket layer (Halo; not shown) and the extension regions 16 in the semiconductor substrate 10.

Figure 3B:
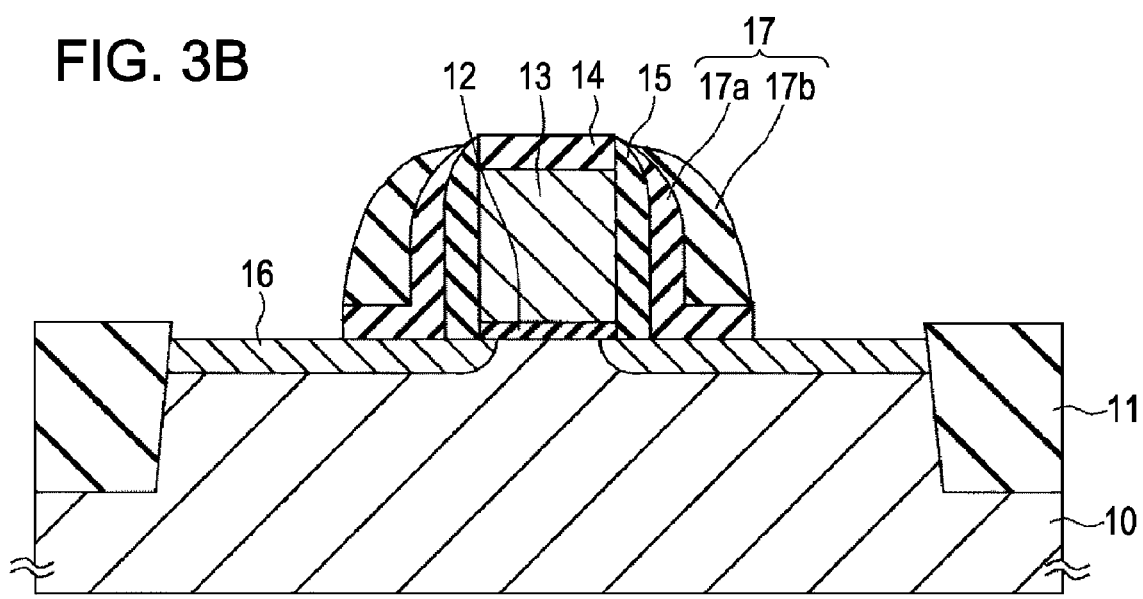

Next, as shown in FIG. 3B, silicon nitride is deposited to a thickness of 20 nm over the entire surface by, for example, a plasma CVD method, and further silicon oxide is deposited to a thickness of 50 nm. Then, etching back is performed over the entire surface to form the sidewall spacers 17 each including the silicon nitride film 17a and the silicon oxide film 17b on both sides of the offset spacers 15 and in contact with the semiconductor substrate 10. Each of the sidewall spacers 17 may be a three-layer laminated insulating film, such as a silicon oxide film/silicon nitride film/silicon oxide film.

Figure 4A:
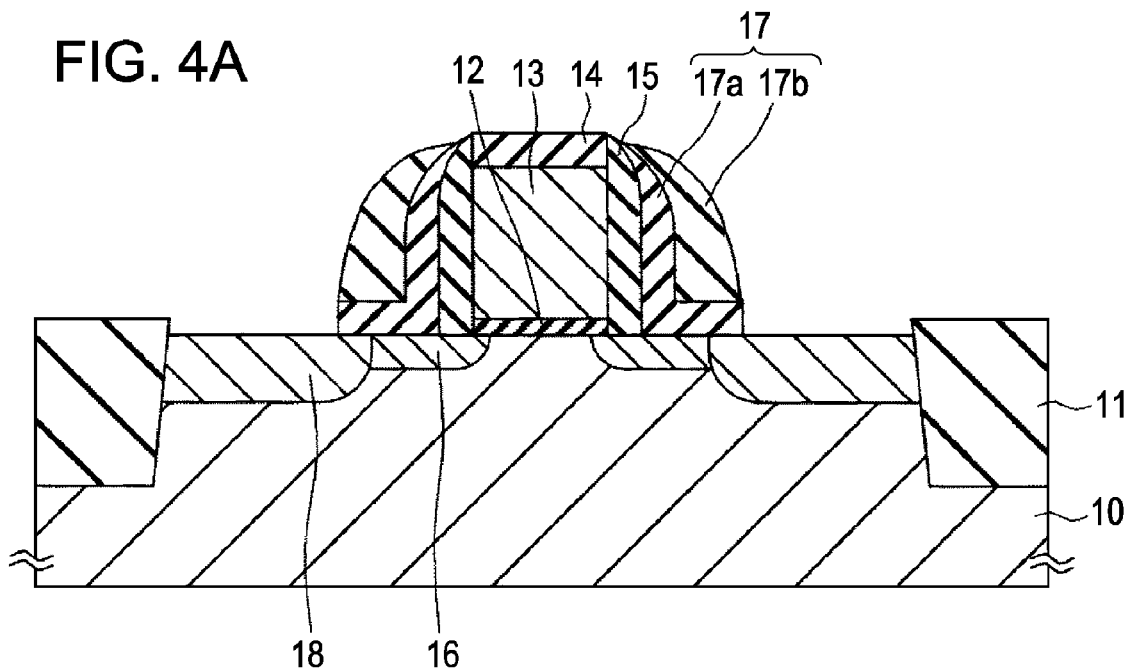
FIGS. 4A and 4B are sectional views each showing a step of the method for manufacturing the semiconductor device according to the first embodiment of the present invention.

Next, as shown in FIG. 4A, the active region is implanted with impurity ions using, for example, the sidewall spacers 17, the offset spacers 15, and the hard mask layer 14 (or the dummy gate electrode 13) as a mask to form the source-drain regions 18 in the semiconductor substrate 10.

For example, boron is implanted in a dose of 1.5 to 3.5× $10^{15}/cm^2$ with an, energy of 2 to 4 keV.

As described above, the source-drain regions 18 each having the extension region 16 are formed in the semiconductor substrate 10 and below at least the offset spacers 15 and the sidewall spacers 17.

Then, a RTA (rapid thermal annealing, 1050° C.) heat treatment is performed for activating impurities.

Figure 4B:
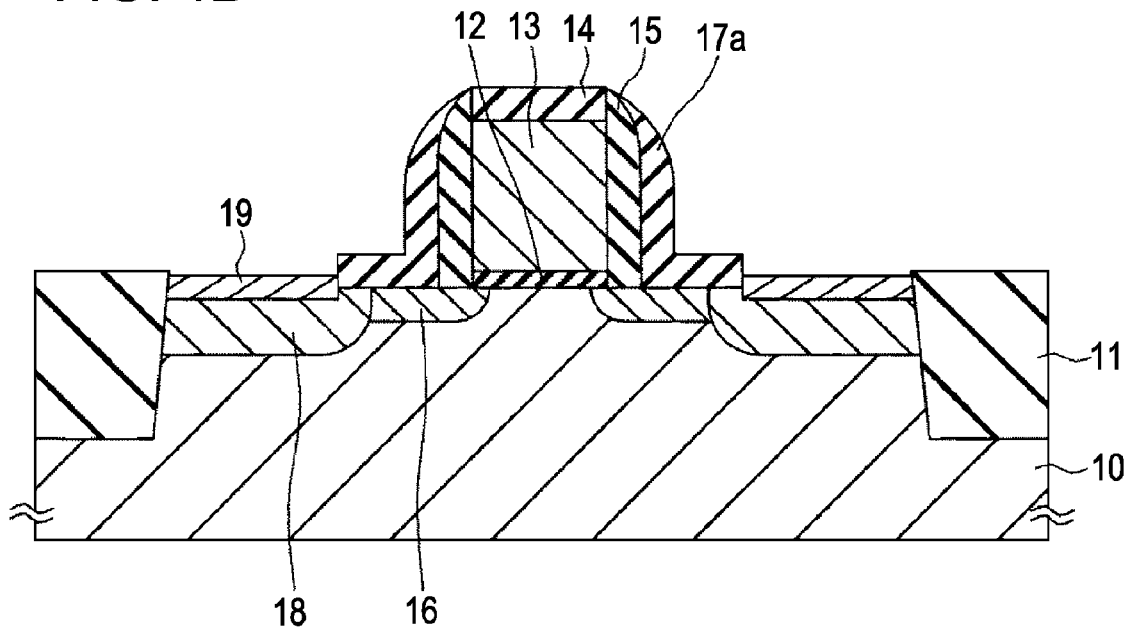

Next, as shown in FIG. 4B, after pre-treatment with dilute hydrofluoric acid (DHF), a refractory metal such as nickel, cobalt, or platinum is deposited to a thickness of 8 nm over the entire surface by sputtering, and then silicidized on the surface of each of the source-drain regions, i.e., at the contact between the refractory metal and silicon, to form the refractory metal silicide layers 19. Then, unreacted refractor metal is removed.

In the DHF treatment, the silicon oxide films 17b constituting the sidewall spacers 17 are removed. Hereinafter, the silicon nitride films 17a may be referred to as the "sidewall spacers".

Figure 5A:
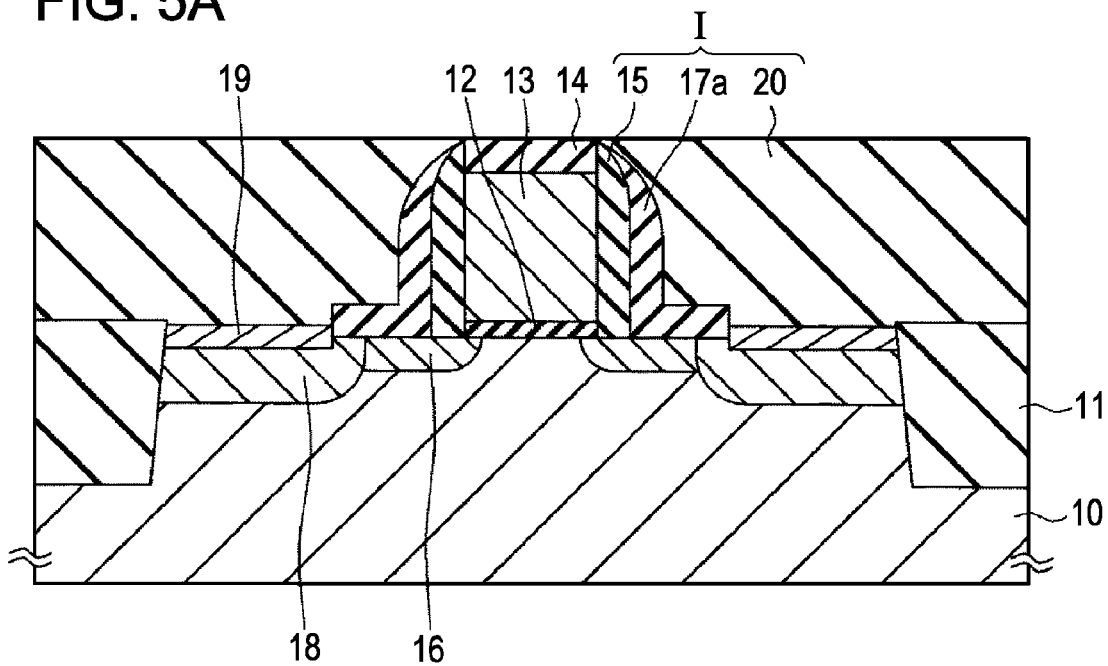
FIGS. 5A and 5B are sectional views each showing a step of the method for manufacturing the semiconductor device according to the first embodiment of the present invention.

Next, as shown in FIG. 5A, silicon oxide is deposited over the entire surface by the CVD method to cover, for example, the hard mask layer 14 (or the dummy gate electrode 13) to form the interlayer insulating film 20. Then, the top surface is polished by the CMP (chemical mechanical polishing) method until the surface of the hard mask layer 14 (or the dummy gate electrode 13) is exposed.

A film including the interlayer insulating film 20 formed as described above, the offset spacers 15, and the silicon nitride films (the sidewall spacers) 17a is referred to as the "insulating film I".

Figure 5B:
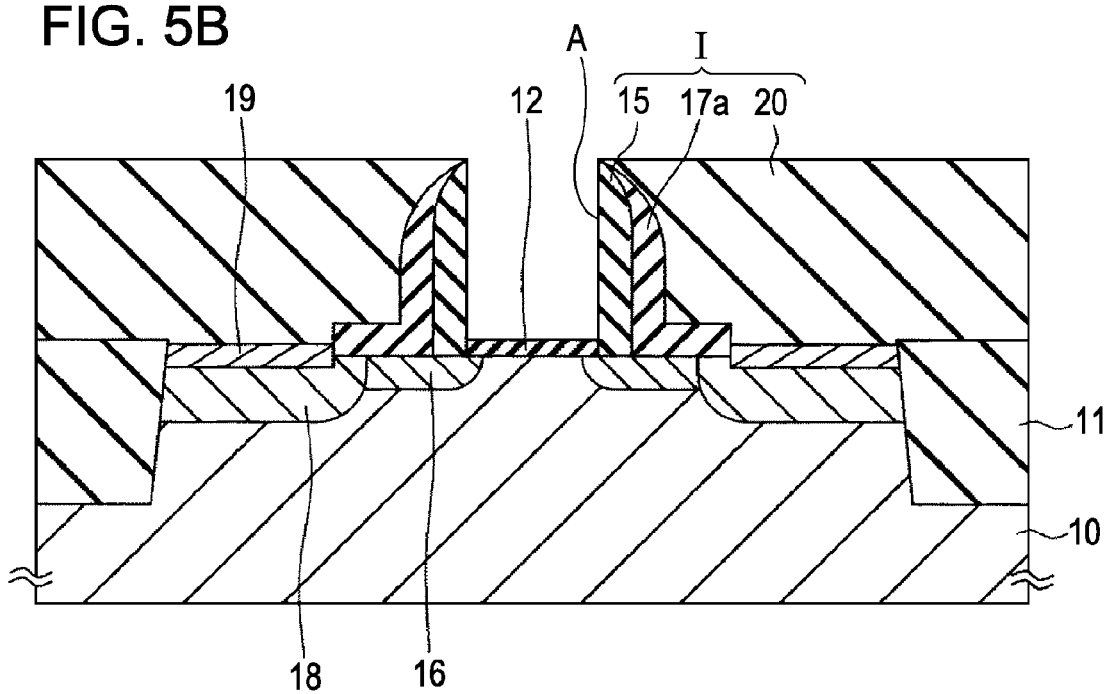

Then, as shown in FIG. 5B, the dummy electrode 13 (and the hard mask layer 14) is removed by, for example, etching under predetermined conditions.

The etching is performed under such conditions that a sufficient selection ratio is exhibited for the dummy gate insulating film of silicon oxide.

Figure 6A:
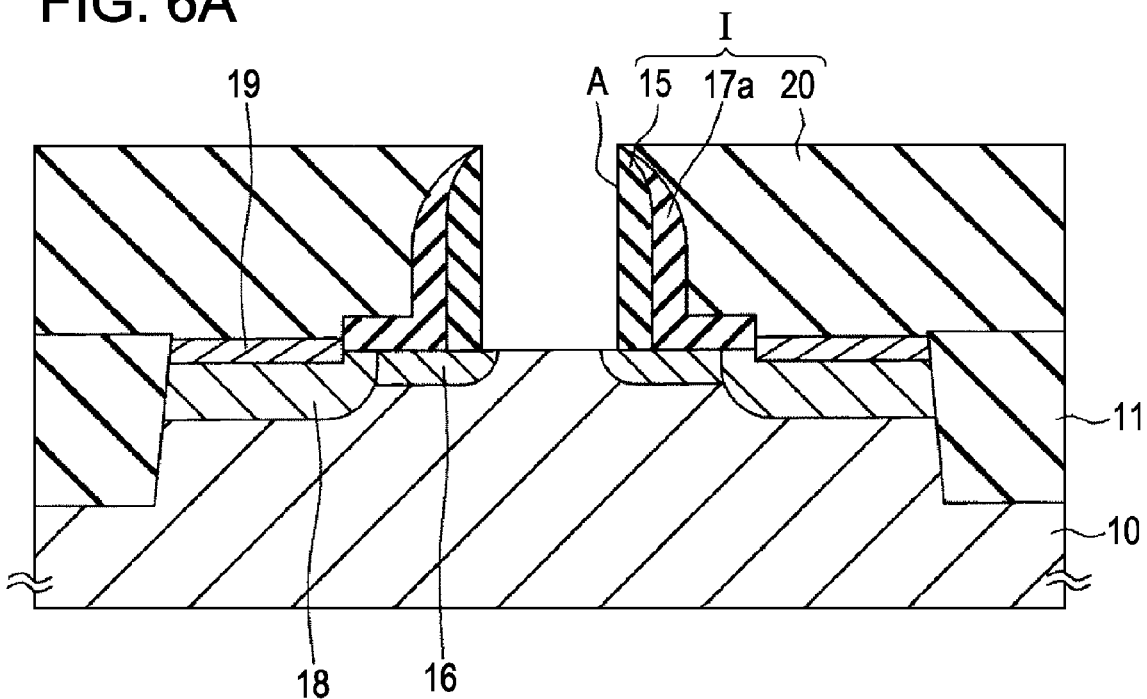
FIGS. 6A and 6B are sectional views each showing a step of the method for manufacturing the semiconductor device according to the first embodiment of the present invention.

Next, as shown in FIG. 6A, the dummy gate insulating film 12 is removed by, for example, etching which will be described in detail below.

The etching for removing the dummy gate insulating film 12 includes a first treatment of treating the exposed surface of the dummy gate insulating film 12 with ammonia and hydrogen fluoride, and a second treatment of decomposing and evaporating the product formed by the first treatment.

The first treatment is described.

The surface of the dummy gate insulating film 12 is chemically etched with a mixed gas containing $NH_3$, HF, and Ar.

Specifically, a wafer (the substrate 10) is conveyed to a chemical etching chamber of an etching apparatus and placed on a wafer stage, and then a gas atmosphere described below is formed to form a Si-containing complex on the surface of the dummy gate insulating film 12.

The gas atmosphere is as follows:
$NH_3$/HF/Ar=50/50/80 sccm, pressure=6.7 Pa, stage temperature=30° C.

A chemical reaction in the mixed gas atmosphere is described below.

When HF/$NH_3$/Ar is supplied as a vapor phase into the chemical etching chamber, the gas is adsorbed according to Langmuir adsorption on the exposed silicon oxide surface of the dummy gate insulating film 12. At the same time, the following chemical reactions proceed.

$$SiO_2 + 4HF \rightarrow SiF_4 + 2H_2O \quad (1)$$

$$SiF_4 + 2NH_3 + 2HF \rightarrow (NH_4)_2SiF_6 \quad (2)$$

Namely, $SiF_4$ and $H_2O$ are produced by a reaction with HF, and then a layer of a $(NH_4)_2SiF_6$ complex is formed on the surface of the silicon oxide insulating layer by a chemical reaction of $NH_3$, HF, and $SiF_4$.

The reaction is controlled by gas adsorption at the level of several molecular layers according to Langmuir adsorption and self-terminated when the coverage of the gas molecules adsorbed is saturated. Therefore, the production of the $(NH_4)_2SiF_6$ complex is also saturated.

In the next second treatment, the wafer covered with the $(NH_4)_2SiF_6$ complex is conveyed to a heating chamber and placed on a heating stage, and then heater heating is started to decompose the $(NH_4)_2SiF_6$ complex into $SiF_4$, etc. and evaporate them.

The heating conditions are as follows:
Stage temperature=200° C., pressure=26.7 Pa The reaction is represented by the reaction below. The $(NH_4)_2SiF_6$ complex deposited on the surface of the dummy gate insulating film 12 of silicon oxide is decomposed into $SiF_4$, $NH_3$, and HF by heating the substrate to 200° C. and evaporated, and then exhausted as gas through a dry pump.

$$(NH_4)_2SiF_6 \rightarrow SiF_4 + 2NH_3 + HF$$

Since the chemical etching uses a surface reaction, it has the advantage in that no difference in density occurs in a pattern.

For example, the etching amount of the dummy insulating film 12 of silicon oxide is controlled to a desired value by determining the gas supply time.

In the treatment of removing the dummy insulating film, the surface of the semiconductor substrate is exposed, but the substrate is not damaged.

As described above, the gate electrode trench A is formed in the insulating film I.

In the above-described etching, as described below, the etching time is selected so that the etching amount of the silicon oxide film formed by the thermal oxidation method can be controlled to be larger than the etching amount of the silicon oxide film formed by the CVD method using TEOS as a raw material. Therefore, the offset spacers 15 are only partially removed until the dummy gate insulating film is completely removed. Although the offset spacers 15 are slightly retracted, it may be possible to prevent widening of the gate electrode trench. Therefore, the performance of a transistor is secured to some extent.

For example, when the thickness of the offset spacers 15 is 8 nm, and the thickness of the dummy gate insulating film 12 is 4 nm, the etching under the above-described etching conditions requires 45 seconds until the dummy gate insulating film 12 is completely removed. During this time, each of the offset spacers 15 is removed by 3.9 nm, thereby leaving the offset spacers in a thickness of about 4.1 nm each.

Figure 6B:
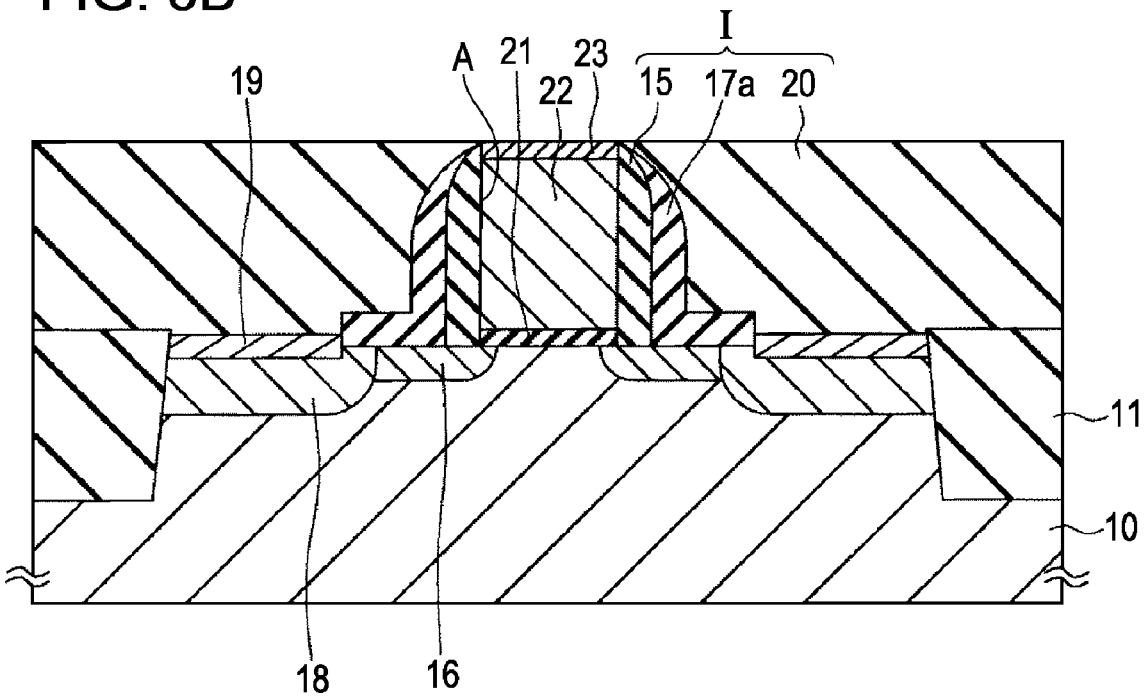

Next, as shown in FIG. 6B, for example, silicon oxynitride is deposited by the thermal oxidation method to cover the bottom of the gate electrode trench A or hafnium oxide or aluminum oxide is deposited by an ALD method to cover the inner surfaces of the gate electrode trench A, forming the gate insulating film 21 composed of a High-k film. After the High-k film is formed, a step is performed at a treatment temperature below 500° C. because the High-k film has low heat resistance.

Next, for example, a conductive material such as a metal material, e.g., ruthenium, titanium nitride, hafnium silicide (HfSix), or tungsten, or polysilicon is deposited on the gate insulating film 21 by the sputtering or CVD method to cover the inner wall of the gate electrode trench A. Then, the conductive material deposited outside the gate electrode trench A is removed by polishing to form the gate electrode 22.

Further, when the gate electrode 22 is formed using polysilicon, the refractory metal silicide layer 23 of NiSi may be formed on the gate electrode 22.

In a subsequent step, silicon oxide is deposited by, for example, the CVD method to cover the insulating film I and the gate electrode 22 (or the refractor metal silicide layer 23), forming the upper insulating film 24.

Next, the openings CH are formed to pass through the upper insulating film 24 and the interlayer insulating film 20 and reach the refractory metal silicide layers 19 of the source-drain regions 18 and the refractory metal silicide layer 23 of the gate electrode 22.

Each of the resultant openings CH is filled with the plug 25 composed of a conductive material such as a metal, and the upper wiring 26 composed of a conductive material is formed on the upper insulating film 24 so as to be connected to the plugs 25.

As described above, a semiconductor device similar to a semiconductor device having the structure shown in FIG. 1 is manufactured.

The offset spacers 15 are used as a mask for forming the extension regions, and thus the end positions of the offset spacers 15 away from the gate electrode 22 are substantially used for positioning the channel-side ends of the extension regions 16 depending on the conditions for activation heat treatment.

The silicon nitride films (sidewall spacers) 17a are also used as a mask for forming the source-drain regions, and thus the end positions of the silicon nitride films (sidewall spacers) 17a away from the gate electrode 22 are substantially used for positioning the channel-side ends of the source-drain regions 18 depending on the conditions for activation heat treatment.

The method for manufacturing the semiconductor device according to this embodiment of the present invention includes forming the offset spacers each including a silicon oxide film having a lower dielectric constant than that of offset spacers composed of silicon nitride when a MOS transistor is formed using the damascene gate process. Since the silicon oxide film is not removed in the manufacturing process, it may be possible to increase the characteristics of a MOS transistor.

Second Embodiment

A semiconductor device according to the second embodiment of the present invention is substantially the same as the first embodiment.

A method of manufacturing the semiconductor device according to this embodiment is described with reference to the drawings.

Figure 7A:
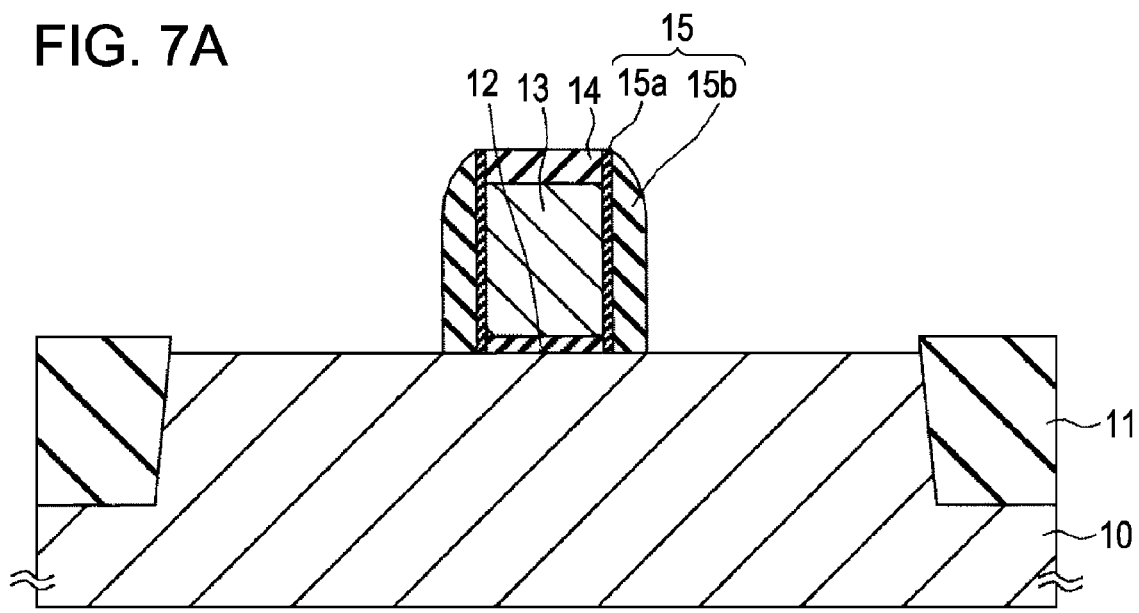
FIGS. 7A and 7B are sectional views each showing a step of a method for manufacturing a semiconductor device according to a second embodiment of the present invention.

First, as shown in FIG. 7A, element isolation insulating films 11 are formed by the STI method, for isolating an active region in a silicon semiconductor substrate 10 having a channel-forming region. Next, silicon oxide is deposited to a thickness of about 4 nm over the entire surface by the thermal oxidation method. Further, polysilicon and silicon nitride are deposited by the CVD method, and photolithographic etching is performed except in the gate-forming region to deposit a dummy gate insulating film 12, a dummy gate electrode 13 composed of polysilicon, and a hard mask layer 14 composed of silicon nitride.

Next, silicon nitride is deposited to a thickness of 0.28 nm over the entire surface by the plasma CVD method or an ALD (atomic layer deposition) method, and further silicon oxide is deposited to a thickness of 8 to 14 nm by the CVD method.

Then, etching back is performed to form offset spacers 15 each including a silicon nitride film 15a and a silicon oxide film 15b on both sides of the dummy gate electrode 13 and in contact with the semiconductor substrate 10.

Figure 7B:
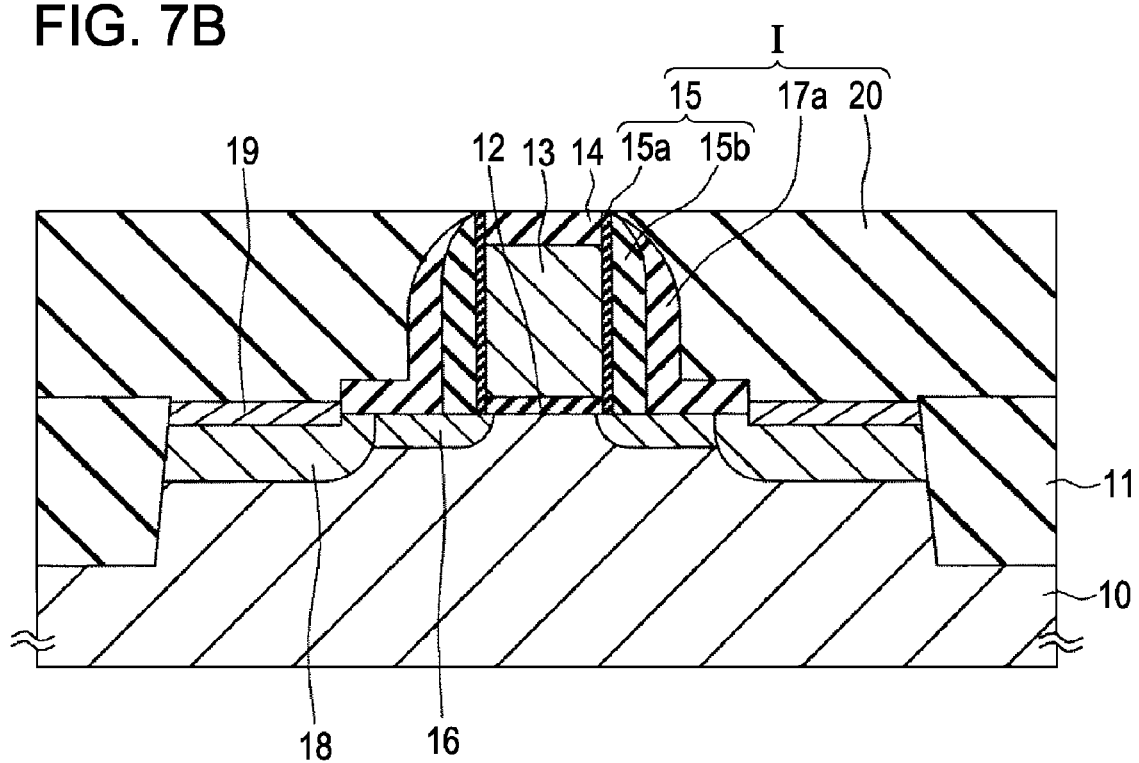

Subsequent steps are the same as in the first embodiment until an interlayer insulating film 20 is formed as shown in FIG. 7B.

Figure 8A:
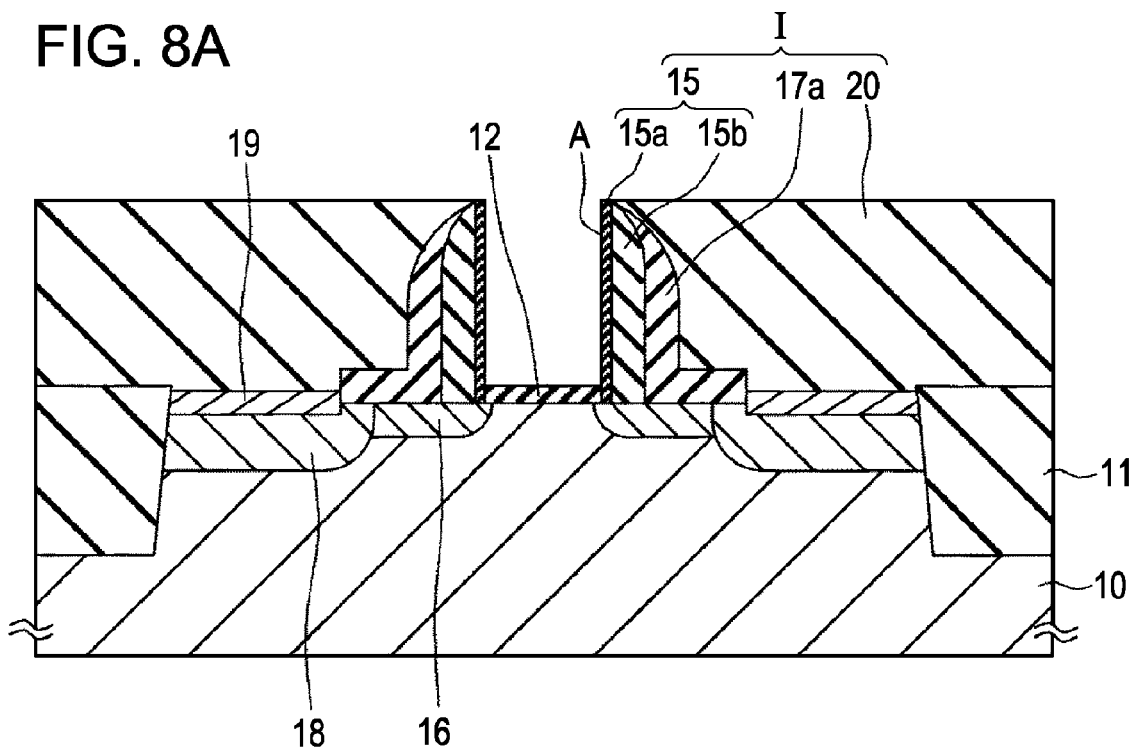
FIGS. 8A and 8B are sectional views each showing a step of the method for manufacturing the semiconductor device according to the second embodiment of the present invention.

Next, as shown in FIG. 8A, the dummy gate electrode 13 (and the hard mask 14) is removed by, for example, etching under predetermined conditions.

The etching is performed under such conditions that a sufficient selection ratio is exhibited for the dummy gate insulating film of silicon oxide.

Figure 8B:
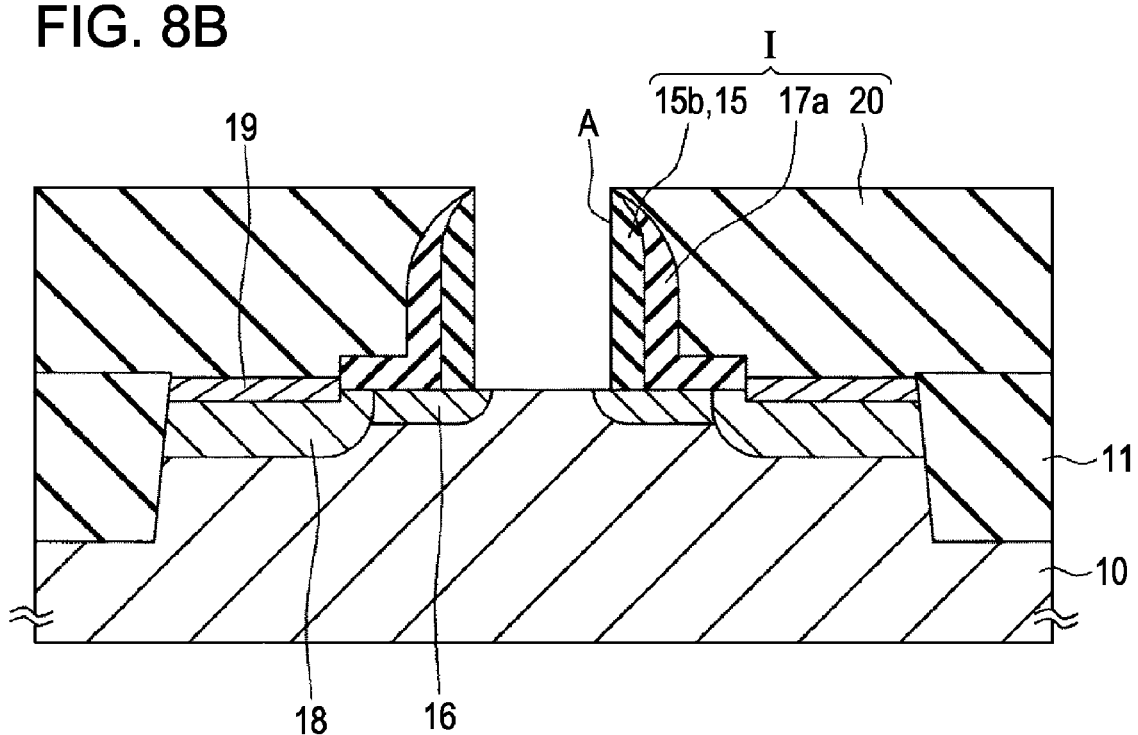

Next, as shown in FIG. 8B, the dummy gate insulating film 12 is removed by, for example, the same etching as that for removing the dummy gate insulting film 12 in the first embodiment.

As described above, the gate electrode trench A is formed in the insulating film I.

In the above-described etching, as described below, the etching rate of silicon nitride is sufficiently lower than that of a silicon oxide film formed by the thermal oxidation method. For example, when each of the offset spacers 15 includes a laminate of a silicon nitride film of 0.28 nm in thickness and a silicon oxide film of 8 nm in thickness, the silicon nitride film 15a of each of the offset spacers 15 is removed by 0.28 nm, i.e., the silicon nitride film is completely removed, during a time of 45 seconds required until the dummy electrode insulating film 12 is completely etched. Therefore, the silicon oxide films 15b of 8 nm in thickness are completely left as they are, thereby preventing widening of the gate electrode trench. At this time, the silicon oxide films 15 constitute the respective offset spacers 15.

As described above, in this embodiment, silicon nitride is previously deposited as a trench-side portion of the offset spacers in such a thickness that the silicon nitride film is just removed during the time required for removing the dummy gate insulating film.

When the treatment time required for removing the dummy gate insulating film is changed, the thickness of the silicon nitride films 15a may be appropriately changed.

This may be applied to DHF treatment for removing the dummy gate insulating film. In this case, 103 seconds are required for removing the silicon oxide film of 4 nm formed by the thermal oxidation method, and silicon nitride is removed by 0.86 nm in the DHF treatment for this time. Therefore, for example, when each of the offset spacers 15 includes a laminate of a silicon nitride film of 0.86 nm in thickness and a silicon oxide film of 8 nm in thickness, the silicon nitride film 15a of each of the offset spacers 15 is removed by 0.86 nm, i.e., the silicon nitride film is completely removed, during the time of 103 seconds required until the dummy electrode insulating film 12 is completely etched. Therefore, the silicon oxide films 15b of 8 nm in thickness are completely left as they are.

Then, as in the first embodiment, for example, the gate insulating film 21, the gate electrode 22, and the refractory metal silicide layer 23 are formed in the gate electrode trench A, the upper insulating film 24 is formed, the openings CH are formed and filled with the plugs 25, and the upper layer wiring 26 is formed.

As described above, a semiconductor device similar to a semiconductor device according to this embodiment is manufactured.

The method for manufacturing the semiconductor device according to this embodiment of the present invention includes forming the offset spacers each including a silicon oxide film having a lower dielectric constant than that of offset spacers composed of silicon nitride when a MOS transistor is formed using the damascene gate process. Since the silicon oxide film is not removed in the manufacturing process, it may be possible to enhance the characteristics of a MOS transistor.

Although the silicon oxide film 15b is used as a film constituting the offset spacers 15, the offset spacers 15 is not limited to this, and a boron-containing silicon nitride (SiBN) film may be used instead of the silicon oxide film. The SiBN film has a lower dielectric constant than that of a silicon nitride film, and the dielectric constant is about 5 at a B/N ratio of 2. Also, the SiBN film has higher acid resistance than that of a silicon oxide film, and thus an etching amount is relatively small. Therefore, even when the SiBN film is used, like in the above-described embodiments, it may be possible to secure high transistor characteristics.

Third Embodiment

Figure 9:
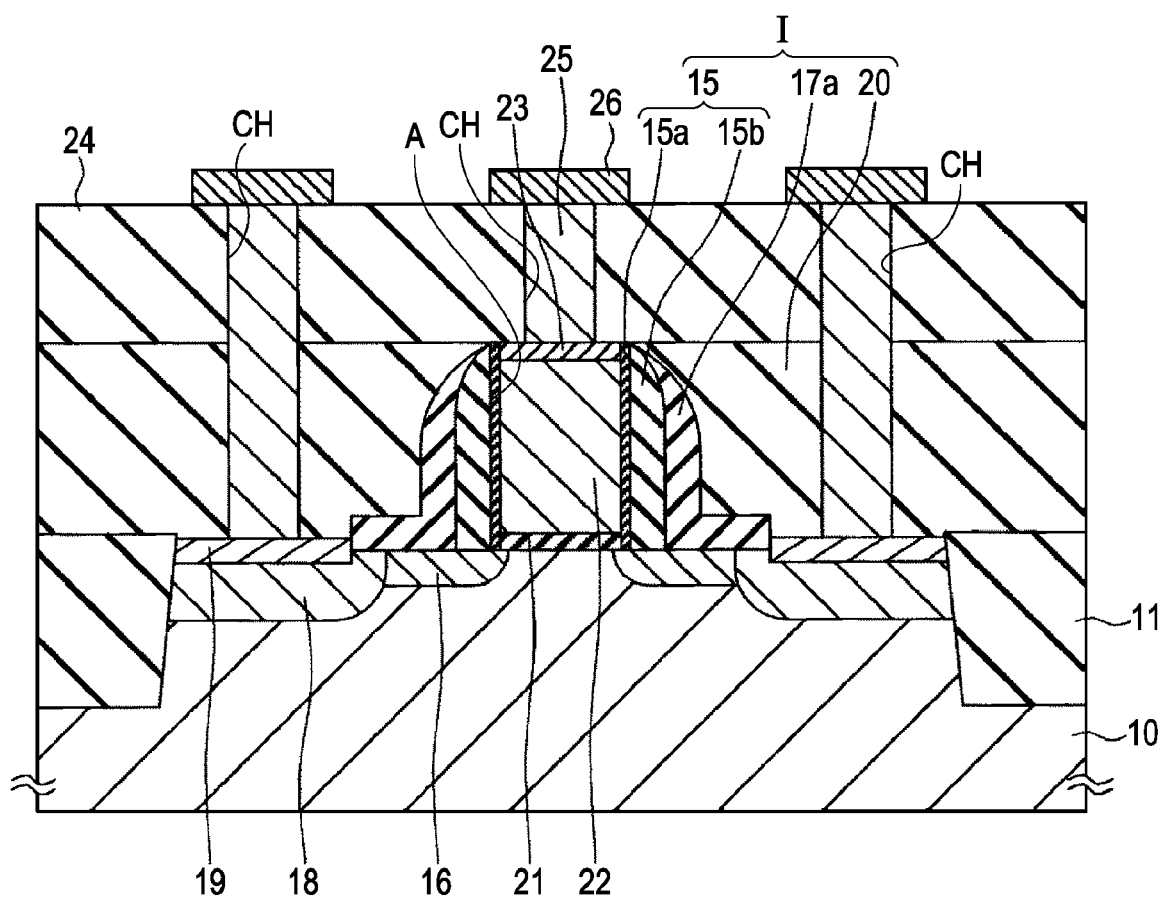
FIG. 9 is a schematic sectional view of a semiconductor device according to a third embodiment of the present invention.

FIG. 9 is a sectional view of a semiconductor device according to the third embodiment.

This embodiment is substantially the same as the first embodiment except that each of offset spacers 15 is left as a laminate of a silicon nitride film 15a and a silicon oxide film 15b. The other components are the same as in the first embodiment.

A method of manufacturing the semiconductor device according to this embodiment will be described with reference to the drawings.

Figure 10A:
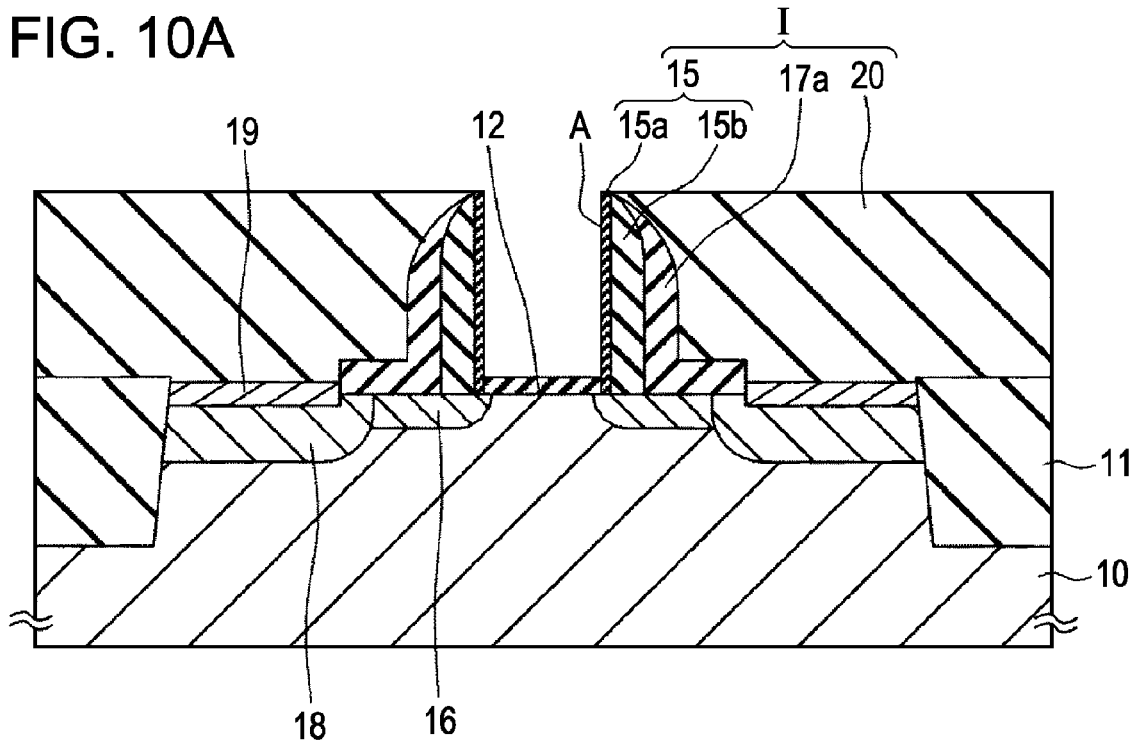
FIGS. 10A and 10B are sectional views each showing a step of a method for manufacturing the semiconductor device according to the third embodiment of the present invention.

First, as shown in FIG. 10A, the same steps as in the second embodiment are performed until the dummy gate electrode 13 (and the hard mask layer 14) is removed.

Figure 10B:
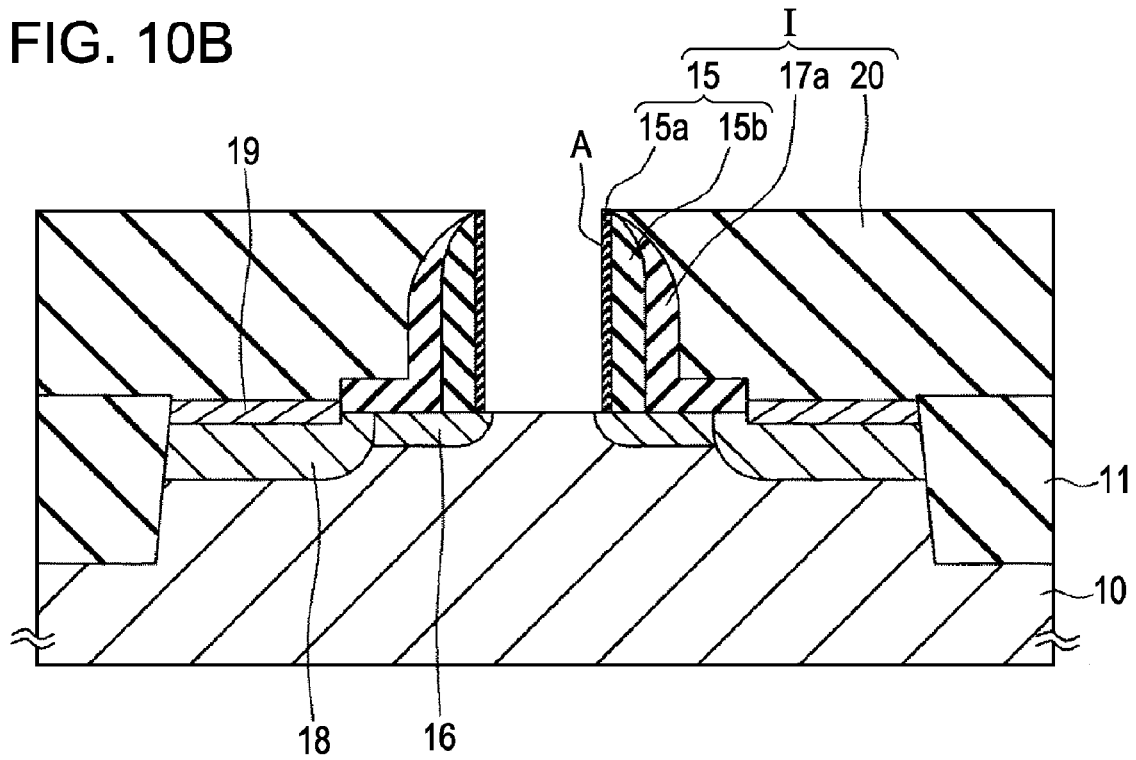

Next, as shown in FIG. 10B, for example, the thickness of the silicon nitride film 15a constituting each of the offset spacers 15 is controlled to such a thickness that the silicon nitride films are not completely removed during the time required for removing the dummy gate insulating film 12 by the same etching for removing the dummy gate insulating film 12 as in the first embodiment or DHF treatment.

As described above, the gate electrode trench A is formed in the insulting film I.

In the above-described etching, as described below, the etching rate of silicon nitride is lower than that of a silicon oxide film formed by the thermal oxidation method. For example, when each of the offset spacers 15 includes a laminate of a silicon nitride film of 0.50 nm in thickness and a silicon oxide film of 8 nm in thickness, the silicon nitride film 15a of each of the offset spacers 15 is removed by 0.28 nm during a time of 45 seconds required until the dummy electrode insulating film 12 is completely etched. That is, the silicon nitride films 15a are thinned to a thickness of 0.22 nm, but are not completely removed. Therefore, the silicon oxide films of 8 nm in thickness are completely left as they are, thereby preventing widening of the gate electrode trench.

As described above, in this embodiment, a silicon nitride film is previously formed as a trench-side portion of the offset spacers in a thickness larger than a thickness that is just removed during the time required for removing the dummy gate insulating film. Even when the silicon nitride films are left, the silicon nitride films having a high dielectric constant are preferably as thin as possible and sufficiently thinner than the silicon oxide films constituting the respective offset spacers.

When the treatment time required for removing the dummy gate insulating film is changed, the thickness of the silicon nitride films 15a may be appropriately changed.

This treatment may be applied to DHF treatment for removing the dummy gate insulating film. In this case, 103 seconds are required for removing the silicon oxide film of 4 nm formed by the thermal oxidation method, and silicon nitride is removed by 0.86 nm in the DHF treatment for this time. Therefore, for example, when each of the offset spacers 15 includes a laminate of a silicon nitride film of 1.3 nm in thickness and a silicon oxide film of 8 nm in thickness, the silicon nitride film 15a of each of the offset spacers 15 is removed by 0.86 nm, i.e., the silicon nitride film is left in a thickness of 0.44 nm, during the time of 103 seconds required until the dummy electrode insulating film 12 is completely etched. Therefore, the silicon oxide films 15b of 8 nm in thickness are completely left as they are.

Then, as in the first embodiment, for example, the gate insulating film 21, the gate electrode 22, and the refractory metal silicide layer 23 are formed in the gate electrode trench A, the upper insulating film 24 is formed, the openings CH are formed and filled with the plugs 25, and the upper layer wiring 26 is formed.

As described above, a semiconductor device similar to a semiconductor device according to this embodiment is manufactured.

The method for manufacturing the semiconductor device according to this embodiment of the present invention includes forming the offset spacers each including a silicon oxide film having a lower dielectric constant than that of offset spacers composed of silicon nitride when a MOS transistor is formed using the damascene gate process. Since the silicon oxide film is not removed in the manufacturing process, it may be possible to increase the characteristics of a MOS transistor.

Fourth Embodiment

Figure 11:
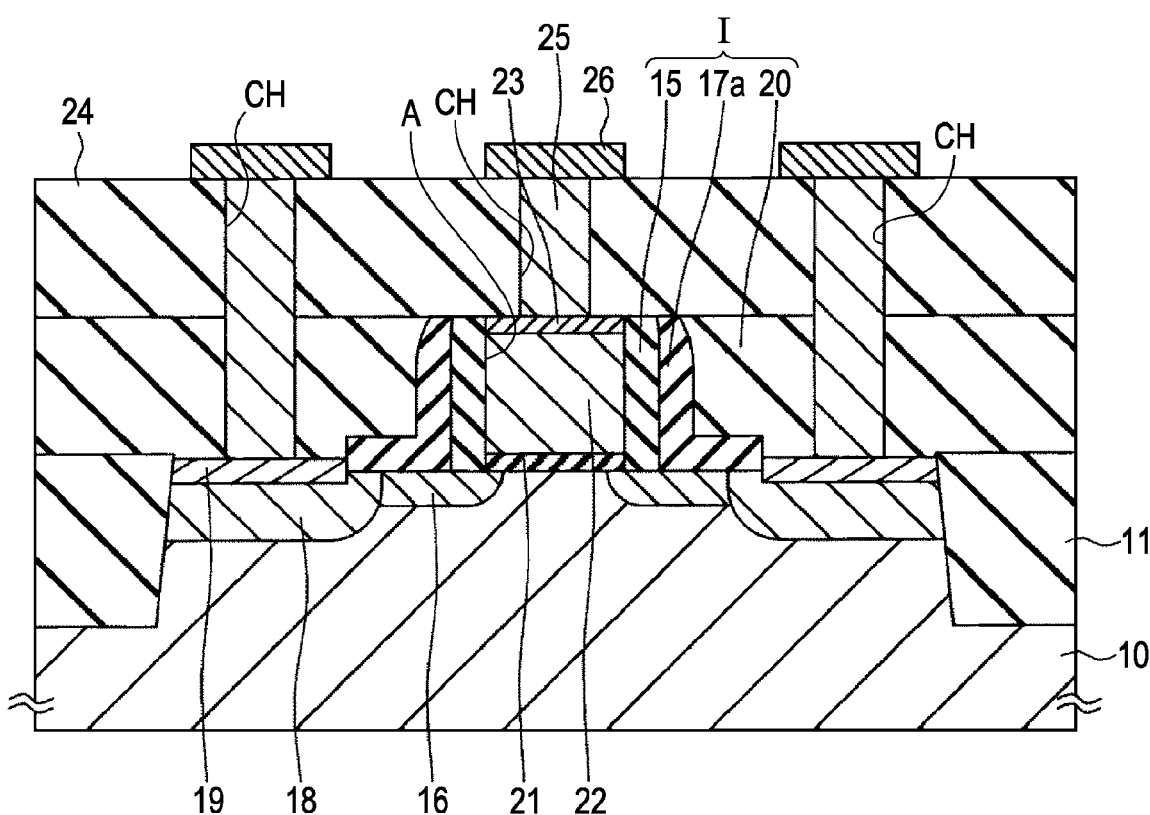
FIG. 11 is a schematic sectional view of a semiconductor device according to a fourth embodiment of the present invention.

FIG. 11 is a sectional view of a semiconductor device according to the fourth embodiment.

This embodiment is substantially the same as the first embodiment except that an insulating film I including offset spacers 15, silicon nitride films (sidewall spacers) 17a, and an interlayer insulating film 20 is further thinned, i.e., the height of a gate electrode 22 is lowered. The other components are the same as in the first embodiment.

A method of manufacturing the semiconductor device according to this embodiment will be described with reference to the drawings.

Figure 12A:
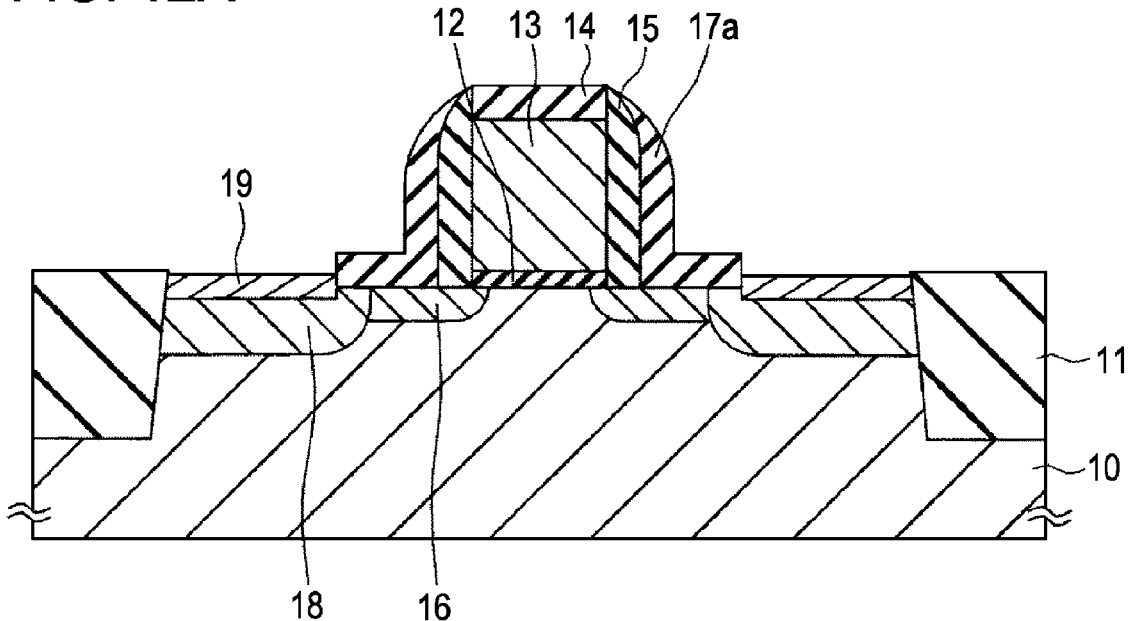
FIGS. 12A and 12B are sectional views each showing a step of a method for manufacturing the semiconductor device according to the fourth embodiment of the present invention.

First, as shown in FIG. 12A, the same steps as in the first embodiment are performed until the refractory metal silicide layer 19 is formed on the surface of each of source-drain regions.

Figure 12B:
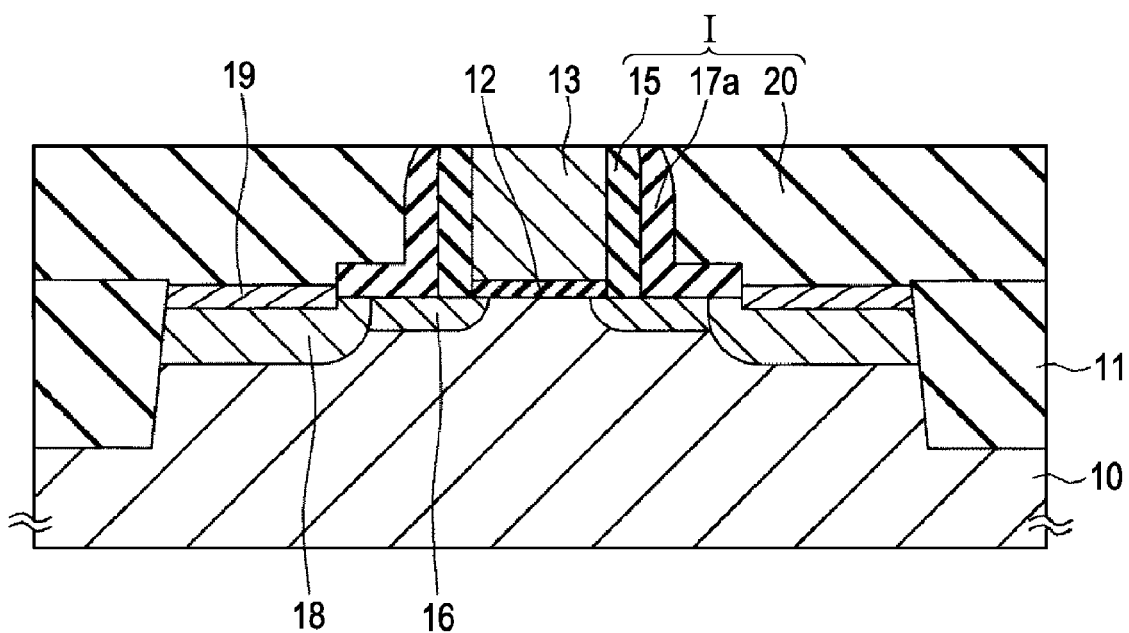

Next, as shown in FIG. 12B, for example, silicon oxide is deposited over the entire surface by the CVD method to cover the hard mask layer 14 (or the dummy gate electrode 13), forming the interlayer insulating film 20, and the top surface is polished by the CMP (chemical mechanical polishing) method until the surface of the hard mask layer 14 (or the dummy gate electrode 13) is exposed.

A film including the interlayer insulating film 20 formed as described above, the offset spacers 15, and the silicon nitride films (the sidewall spacers) 17a is referred to as the "insulating film I".

In this embodiment, polishing is further performed to thin the insulating film I.

For example, when the hard mask 14 is present, the insulating film I may be polished until the hard mask layer 14 is completely polished to expose the surface of the dummy gate electrode 13 or may be polished to an intermediate height of the dummy gate electrode 13.

When the hard mask layer 14 is not present, the insulating film I is removed by polishing to an intermediate height of the dummy gate electrode 13.

Then, as in the first embodiment, the dummy gate electrode 13 (and the hard mask layer 14) and the dummy gate insulating film 12 are removed to form the gate electrode trench A in the insulating film I, the gate insulating film 21, the gate electrode 22, and the refractory metal silicide layer 23 are formed in the gate electrode trench A, the upper insulating film 24 is formed, the openings CH are formed and filled with the plugs 25, and the upper layer wiring 26 is formed.

As described above, a semiconductor device similar to a semiconductor device according to this embodiment is manufactured.

The method for manufacturing the semiconductor device according to this embodiment of the present invention includes forming the offset spacers each including a silicon oxide film having a lower dielectric constant than that of offset spacers composed of silicon nitride when a MOS transistor is formed using the damascene gate process. Since the silicon oxide film is not removed in the manufacturing process, it may be possible to enhance the characteristics of a MOS transistor.

In this embodiment, as in the second embodiment, a silicon nitride film may be previously formed as a trench-side portion of the offset spacers in such a thickness that the silicon nitride is just removed during a time required for removing the dummy gate insulating film.

Fifth Embodiment

Figure 13:
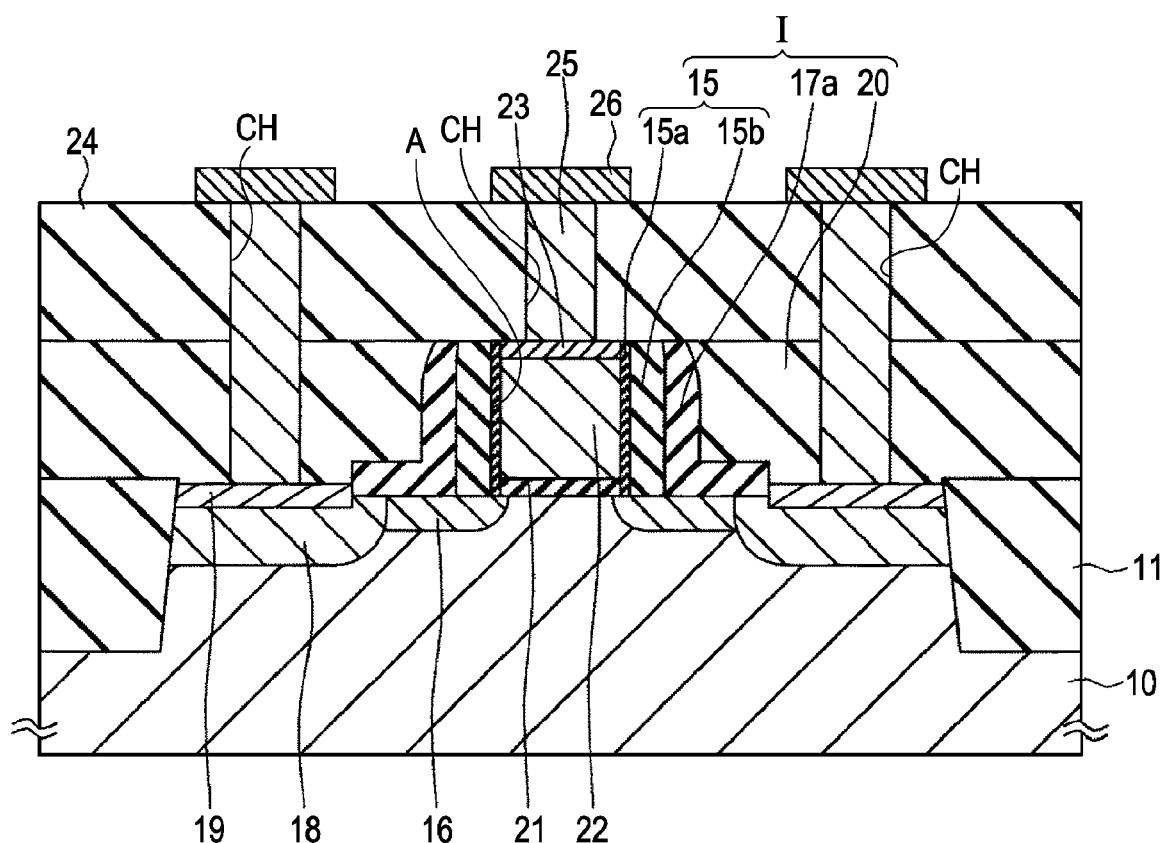
FIG. 13 is a schematic sectional view of a semiconductor device according to a fifth embodiment of the present invention.
Figure 14:
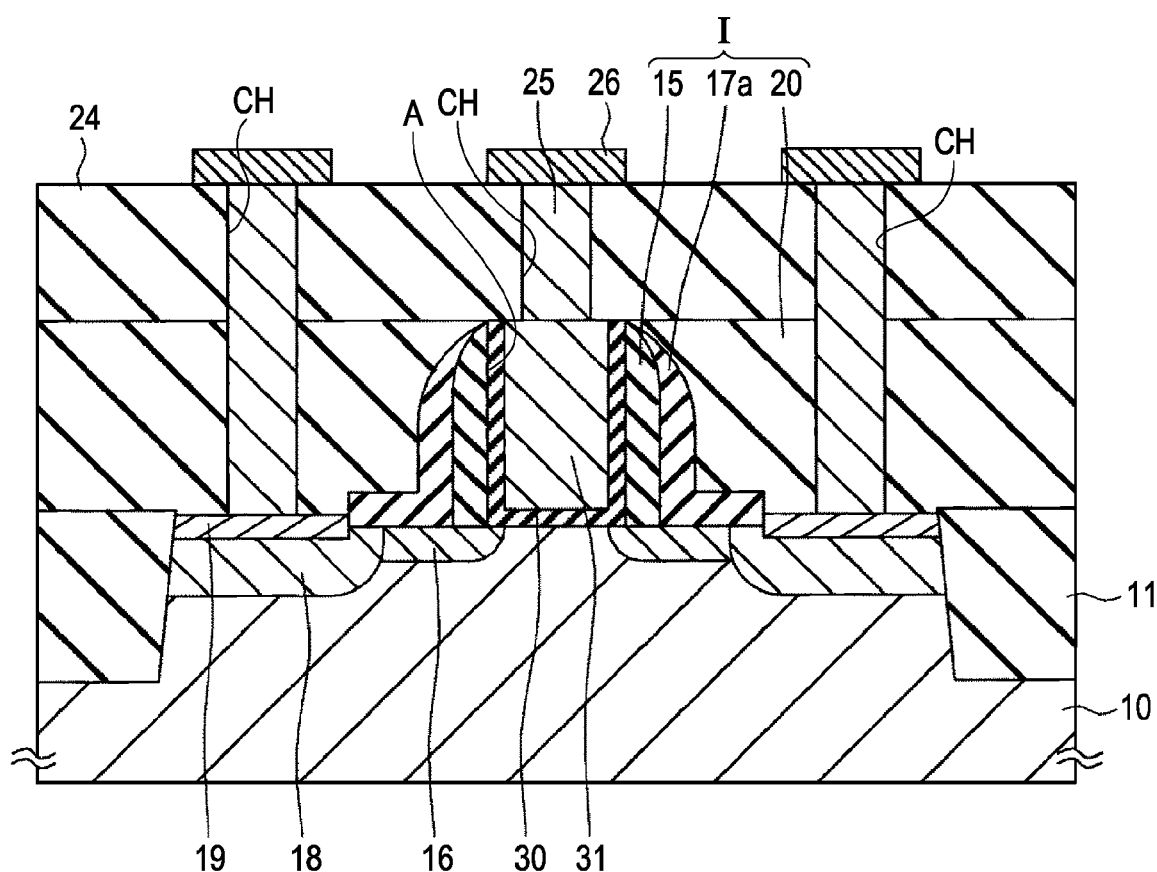
FIG. 14 is a schematic sectional view of a semiconductor device according to a sixth embodiment of the present invention.
Figure 15:
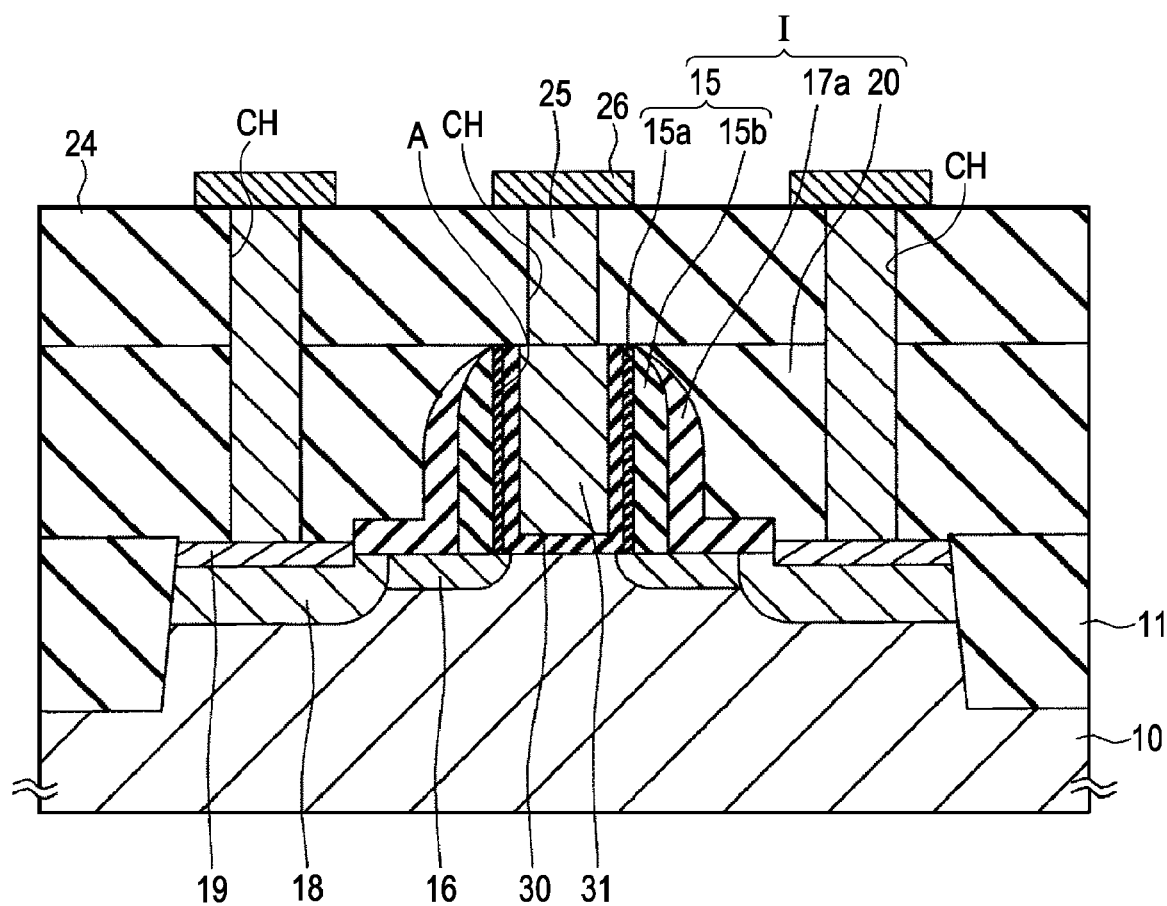
FIG. 15 is a schematic sectional view of a semiconductor device according to a seventh embodiment of the present invention.
Figure 16:
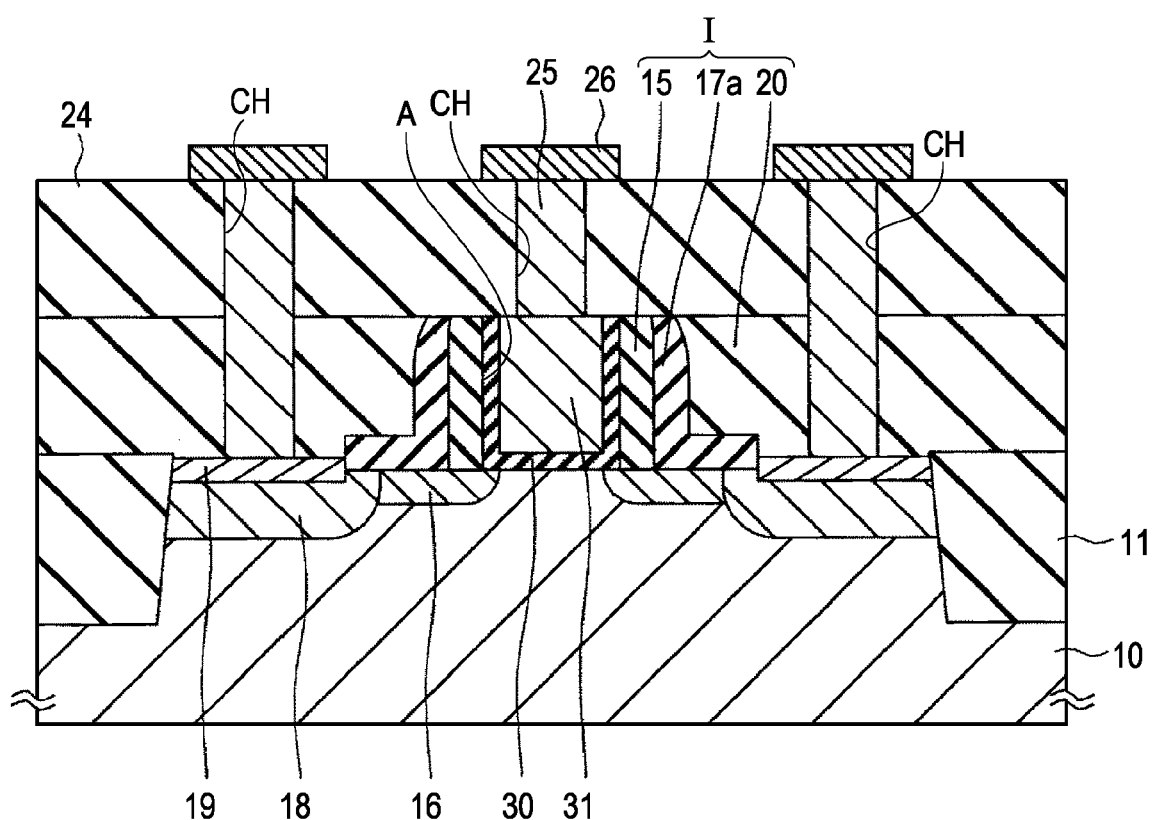
FIG. 16 is a schematic sectional view of a semiconductor device according to an eighth embodiment of the present invention.
Figure 17:
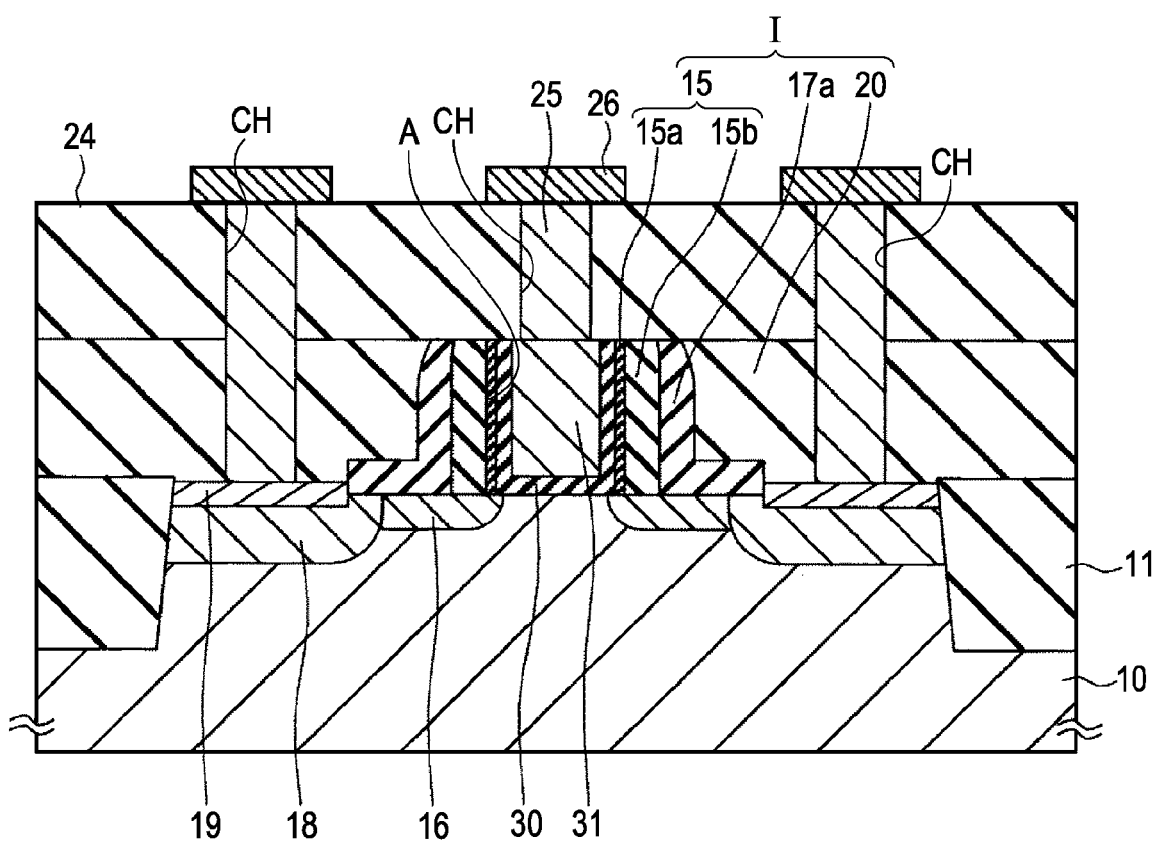
FIG. 17 is a schematic sectional view of a semiconductor device according to a ninth embodiment of the present invention.

FIG. 13 is a sectional view of a semiconductor device according to the fifth embodiment.

This embodiment is substantially the same as the third embodiment except that as in the fourth embodiment, an insulating film I including offset spacers 15, silicon nitride films (sidewall spacers) 17a, and an interlayer insulating film 20 is thinned, i.e., the height of a gate electrode 22 is lowered. The other components are the same as in the third embodiment.

A method of manufacturing the semiconductor device according to this embodiment is the same as the third embodiment except that as in the fourth embodiment, the insulating film I is further thinned.

In the method for manufacturing the semiconductor device according to this embodiment of the present invention, when a MOS transistor is formed using the damascene gate process, the offset spacers each including a silicon oxide film having a lower dielectric constant than that of offset spacers composed of silicon nitride are formed. Since the silicon oxide film is not removed in the manufacturing process, it may be possible to enhance the characteristics of a MOS transistor.

Sixth Embodiment

FIGS. 14 to 17 are each a sectional view of a semiconductor device according to an embodiment of the present invention.

These embodiments are substantially the same as the first to fifth embodiments except that agate insulating film 30 composed of a so-called High-k material such as hafnium oxide or aluminum oxide is formed by the ALD method to cover the inner wall of a gate electrode trench A, and the gate electrode trench A is filled with a metal material such as ruthenium or tungsten to form a gate electrode 31 on the gate insulating film 30.

FIGS. 14, 15, 16, and 17 correspond to the first and second embodiments, the third embodiment, the fourth embodiment, and the fifth embodiment, respectively.

In the method for manufacturing the semiconductor device according to an embodiment of the present invention, when a MOS transistor is formed using the damascene gate process, the offset spacers each including a silicon oxide film having a lower dielectric constant than that of offset spacers composed of silicon nitride are formed. Since the silicon oxide film is not removed in the manufacturing process, it may be possible to enhance the characteristics of a MOS transistor.

EXAMPLE

With respect to the etching method for removing the dummy gate insulating film in the first embodiment, a relation between the etching time and etching amount was examined for (a) a silicon oxide film formed by the thermal oxidation method, (b) a silicon oxide film formed by the plasma CVD method using TEOS as a raw material, and (c) a silicon nitride film formed by the plasma CVD method.

The results are shown in FIG. 18.

FIG. 18 shows that at an etching time of over 40 seconds, the etching amount of (a) the silicon oxide film formed by the thermal oxidation method becomes larger than that of (b) the silicon oxide film formed by the plasma CVD method using TEOS as a raw material. Therefore, when these films (a) and (b) are used as materials for a dummy gate insulating film and offset spacers, respectively, the dummy gate electrode can be removed, leaving the offset spacers.

Further, the etching amount of (c) the silicon nitride film is constantly smaller than that of (a) the silicon oxide film formed by the thermal oxidation method. Therefore, when these films (a) and (c) are used as materials for a dummy gate insulating film and offset spacers, respectively, the dummy gate electrode can be removed, leaving the offset spacers.

The present invention is not limited to the above description.

For example, materials for the gate insulating film and the gate electrode are not limited to the above-described embodiments.

The refractory metal silicide layer is not necessarily formed.

For example, a boron-containing silicon nitride (SiBN) film may be used instead of the silicon oxide film in the first embodiment, a laminate of a silicon nitride film and a boron-containing silicon nitride film may be used instead of the laminate of the silicon nitride film and the silicon oxide film in the second embodiment, and a laminate of a boron-containing silicon nitride film and a silicon oxide film may be used instead of the laminate of the silicon nitride film and the silicon oxide film in the third embodiment. The boron-containing silicon nitride film has a lower dielectric constant than that of a silicon nitride film, and the dielectric constant is about 5 at a B/N ratio of 2. Also, the SiBN film has higher acid resistance than that of a silicon oxide film, and thus an etching amount is relatively small. Therefore, it may be possible to form thinner offset spacers as compared with when a silicon oxide film is used for the offset spacers.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising a field effect transistor including:
- a semiconductor substrate having a channel-forming region;
- a gate electrode trench in an insulating film on the semiconductor substrate;
- a gate insulating film at the bottom of the gate electrode trench;
- a gate electrode on the gate insulating film to fill the gate electrode trench;
- an insulating film on the semiconductor substrate including
    - (a) offset spacers composed of boron-containing silicon nitride and formed as a sidewall of the gate electrode trench,
    - (b) sidewall spacers on both sides of the offset spacers away from the gate electrode, and
    - (c) an interlayer insulating film;
- and
- source-drain regions each having an extension region and formed in the semiconductor substrate and below at least the offset spacers and the sidewall spacers.

2. The semiconductor device according to claim 1, wherein the gate electrode-side ends of the offset spacers are a means for positioning the channel-side ends of the extension regions.

3. The semiconductor device according to claim 1, wherein the gate electrode is composed of a metal selected from the group consisting of tungsten, hafnium, tantalum, titanium, molybdenum, ruthenium, nickel, and platinum, an alloy containing the metal, or a compound of the metal.

4. A semiconductor device comprising a field effect transistor including:
- a semiconductor substrate having a channel-forming region;
- a gate electrode trench in an insulating film on the semiconductor substrate;
- a gate insulating film at the bottom of the gate electrode trench;
- a gate electrode on the gate insulating film to fill the gate electrode trench;
- an insulating film on the semiconductor substrate including
    - (a) offset spacers formed as a sidewall of the gate electrode trench, each offset spacer including a first film composed of boron-containing silicon nitride and a second film composed of silicon oxide, which are laminated from the gate electrode side,
    - (b) sidewall spacers on both sides of the offset spacers away from the gate electrode, and
    - (c) an interlayer insulating film;
- and
- source-drain regions each having an extension region and formed in the semiconductor substrate and below at least the offset spacers and the sidewall spacers,
- wherein,
    - the first film is in contact with the gate electrode.

5. The semiconductor device according to claim 4, wherein the gate electrode-side ends of the offset spacers are a means for positioning the channel-side ends of the extension regions.

6. The semiconductor device according to claim 4, wherein in each of the offset spacers, the first film is thinner than the second film.

7. The semiconductor device according to claim 4, wherein the gate electrode is composed of a metal selected from the group consisting of tungsten, hafnium, tantalum, titanium, molybdenum, ruthenium, nickel, and platinum, an alloy containing the metal, or a compound of the metal.

* * * * *